United States Patent
Hwang et al.

(10) Patent No.: US 11,715,684 B2
(45) Date of Patent: Aug. 1, 2023

(54) SEMICONDUCTOR DEVICE AND MASSIVE DATA STORAGE SYSTEM INCLUDING THE SAME

(71) Applicant: SAMSUNG ELECTRONICS CO., LTD., Suwon-si (KR)

(72) Inventors: Sungmin Hwang, Hwaseong-si (KR); Jiwon Kim, Seoul (KR); Jaeho Ahn, Seoul (KR); Joonsung Lim, Seongnam-si (KR); Sukkang Sung, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 18 days.

(21) Appl. No.: 17/376,240

(22) Filed: Jul. 15, 2021

(65) Prior Publication Data
US 2022/0139821 A1 May 5, 2022

(30) Foreign Application Priority Data
Oct. 30, 2020 (KR) .................. 10-2020-0142898

(51) Int. Cl.
| | |
|---|---|
| *H01L 27/115* | (2017.01) |
| *H01L 23/31* | (2006.01) |
| *H01L 23/522* | (2006.01) |
| *H01L 23/00* | (2006.01) |
| *H01L 25/065* | (2023.01) |
| *H01L 25/18* | (2023.01) |
| *H10B 43/27* | (2023.01) |

(52) U.S. Cl.
CPC ...... *H01L 23/5223* (2013.01); *H01L 23/5226* (2013.01); *H01L 23/5227* (2013.01);
(Continued)

(58) Field of Classification Search
CPC ..... H01L 28/10; H01L 27/11273–1128; H01L 27/11514; H01L 27/11578–11582;
(Continued)

(56) References Cited

U.S. PATENT DOCUMENTS

| | | |
|---|---|---|
| 8,951,859 B2 | 2/2015 | Higashitani et al. |
| 9,691,782 B1 | 6/2017 | Hwang et al. |
| (Continued) | | |

FOREIGN PATENT DOCUMENTS

| | | |
|---|---|---|
| CN | 111033739 | 4/2020 |
| KR | 1020120121171 | 11/2012 |
| WO | 2019052127 | 3/2019 |

OTHER PUBLICATIONS

Extended European Search Report dated Mar. 14, 2022 in corresponding European Patent Application No. 21196705.4.

*Primary Examiner* — Mary A Wilczewski
*Assistant Examiner* — Tsz K Chiu
(74) *Attorney, Agent, or Firm* — F. Chau & Associates, LLC

(57) ABSTRACT

A semiconductor device includes lower circuit patterns on a lower substrate; lower bonding patterns on the lower circuit patterns, the lower bonding patterns including a conductive material and being electrically connected to the lower circuit patterns; upper bonding patterns on and contacting the lower bonding patterns, and including a conductive material; a passive device on the upper bonding patterns, and including a conductive material and contacting one of the upper bonding patterns; a gate electrode structure on the passive device, and including gate electrodes spaced apart from each other in a first direction, each of which extends in a second direction, and extension lengths in the second direction of the gate electrodes increasing from a lowermost level toward an uppermost level in a stepwise manner; a channel extending through at least a portion of the gate electrode structure; and an upper substrate on the channel.

18 Claims, 31 Drawing Sheets

(52) U.S. Cl.
CPC .......... *H01L 23/5228* (2013.01); *H01L 24/20* (2013.01); *H01L 24/24* (2013.01); *H01L 25/0657* (2013.01); *H01L 25/18* (2013.01); *H01L 2224/2105* (2013.01); *H01L 2224/24146* (2013.01); *H01L 2924/1431* (2013.01); *H01L 2924/14511* (2013.01); *H10B 43/27* (2023.02)

(58) Field of Classification Search
CPC ... H01L 27/11597; H01L 27/2481–249; H01L 23/5227; H01L 28/20–26; H01L 28/40–92; H01L 2224/2105; H01L 2224/24146; H01L 2924/1431; H01L 2924/14511; H01L 2224/08145; H01L 2224/32145; H10B 43/27; H10B 41/27; H10B 43/10; H10B 43/35; H10B 43/40; H10B 43/50
See application file for complete search history.

(56) References Cited

U.S. PATENT DOCUMENTS

| | | | |
|---|---|---|---|
| 9,748,206 B1* | 8/2017 | Huang | .................. H01L 23/564 |
| 9,991,282 B1 | 6/2018 | Shimizu et al. | |
| 10,115,667 B2 | 10/2018 | Yun et al. | |
| 10,141,372 B2* | 11/2018 | Park | ........................ H10B 43/10 |
| 10,283,452 B2 | 5/2019 | Zhu et al. | |
| 10,510,415 B1* | 12/2019 | Huo | .................. H01L 27/11582 |
| 10,559,577 B2 | 2/2020 | Yun et al. | |
| 10,573,679 B2 | 2/2020 | Kwon | |
| 10,600,763 B1* | 3/2020 | Xiao | ................... H01L 27/0688 |
| 10,636,806 B2 | 4/2020 | Lee | |
| 10,985,142 B2* | 4/2021 | Xiao | ........................ H01L 24/08 |
| 11,233,041 B2* | 1/2022 | Huang | ..................... H01L 24/08 |
| 2015/0021785 A1* | 1/2015 | Lin | ........................ H01L 24/89 |
| | | | 438/459 |
| 2016/0079164 A1* | 3/2016 | Fukuzumi | ......... H01L 27/11582 |
| | | | 438/107 |
| 2018/0261623 A1* | 9/2018 | Higashi | ............. H01L 27/11582 |
| 2019/0043868 A1 | 2/2019 | Hasnat et al. | |
| 2019/0296041 A1 | 9/2019 | Yamasaka et al. | |
| 2020/0066745 A1* | 2/2020 | Yu | ..................... H01L 27/11582 |
| 2020/0091240 A1 | 3/2020 | Hong | |
| 2020/0194452 A1* | 6/2020 | Xiao | .................. H01L 27/11582 |
| 2021/0104543 A1* | 4/2021 | Xiao | .................. H01L 21/76877 |
| 2021/0134778 A1* | 5/2021 | Huang | ..................... H01L 25/18 |
| 2022/0068963 A1* | 3/2022 | Lee | ........................ H01L 23/528 |
| 2022/0101911 A1* | 3/2022 | Kanamori | .......... G11C 16/0483 |

* cited by examiner

FIG. 4
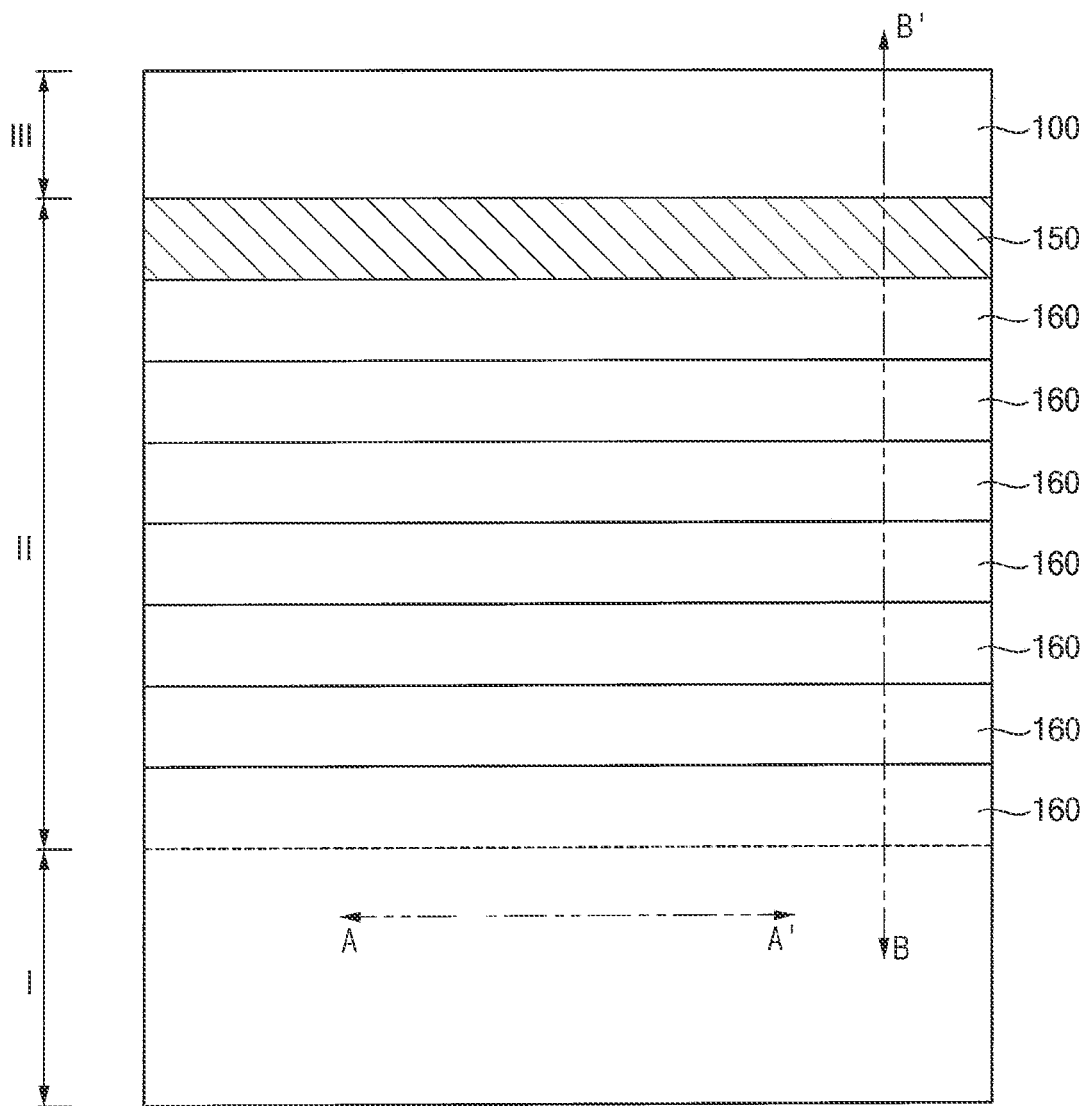
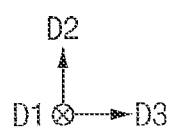

SEMICONDUCTOR DEVICE AND MASSIVE DATA STORAGE SYSTEM INCLUDING THE SAME

CROSS-REFERENCE TO RELATED APPLICATIONS

This application claims priority under 35 U.S.C. § 119 to Korean Patent Application No. 10-2020-0142898, filed on Oct. 30, 2020 in the Korean Intellectual Property Office (KIPO), the disclosure of which is incorporated by reference herein in its entirety.

TECHNICAL FIELD

Embodiments of the inventive concept relate to a semiconductor device and a massive data storage system including the same.

DISCUSSION OF RELATED ART

An electronic system may include a high capacity semiconductor device that stores a large amount of data. Thus, a method of increasing the data storage capacity of high capacity semiconductor devices has been studied. For example, a semiconductor device including memory cells that may be three-dimensionally stacked may be utilized.

As the number of stacks of the memory cells in the semiconductor device increases, the number of wirings for applying electrical signals also increases, and thus, a method of effectively arranging the wirings may be implemented.

SUMMARY

Example embodiments provide a semiconductor device having improved characteristics.

Example embodiments provide a massive data storage system including a semiconductor device having improved characteristics.

According to an aspect of the inventive concept, there is provided a semiconductor device. The semiconductor device may include lower circuit patterns, lower bonding patterns, upper bonding patterns, a passive device, a gate electrode structure, a channel, and an upper substrate. The lower circuit patterns may be formed on a lower substrate. The lower bonding patterns may be formed on the lower circuit patterns, and may include a conductive material and be electrically connected to ones of the lower circuit patterns, respectively. The upper bonding patterns may be formed on and contact the lower bonding patterns, respectively, and may include a conductive material. The passive device may be formed on the upper bonding patterns, and may include a conductive material and contact one of the upper bonding patterns. The gate electrode structure may be formed on the passive device, and may include gate electrodes spaced apart from each other in a first direction perpendicular to an upper surface of the lower substrate. Each of the gate electrodes may extend in a second direction parallel to the upper surface of the lower substrate, and extension lengths in the second direction of the gate electrodes may increase from a lowermost level toward an uppermost level in a stepwise manner. The channel may extend through at least a portion of the gate electrode structure. The upper substrate may be formed on the channel.

According to an aspect of the inventive concept, there is provided a semiconductor device. The semiconductor device may include lower circuit patterns, lower bonding patterns, upper bonding patterns, a first wiring, a gate electrode structure, a channel, and an upper substrate. The lower circuit patterns may be formed on a lower substrate. The lower bonding patterns may be formed on the lower circuit patterns, and may include a conductive material and be electrically connected to ones of the lower circuit patterns, respectively. The upper bonding patterns may be formed on and contact the lower bonding patterns, respectively, and may include a conductive material. The first wiring may be formed on the upper bonding patterns, and may contact ones of the upper bonding patterns. The gate electrode structure may be formed on the first wiring, and may include gate electrodes spaced apart from each other in a first direction perpendicular to an upper surface of the lower substrate. Each of the gate electrodes may extend in a second direction parallel to the upper surface of the lower substrate, and extension lengths in the second direction of the gate electrodes may increase from a lowermost level toward an uppermost level in a stepwise manner. The channel may extend through at least a portion of the gate electrode structure. The upper substrate may be formed on the channel Ones of the lower circuit patterns may be electrically connected with each other through the first wiring, the ones of the upper bonding patterns, and ones of the lower bonding patterns contacting the ones of the upper bonding patterns, respectively.

According to an aspect of the inventive concept, there is provided a semiconductor device. The semiconductor device may include an upper substrate, memory cells under the upper substrate, a passive device under the memory cells, upper bonding patterns under the passive device, lower bonding patterns under and contacting the upper bonding patterns, respectively, transistors under and electrically connected to the lower bonding patterns, respectively, and a lower substrate under the transistors. The passive device may contact one of the upper bonding patterns to be electrically connected to one of the transistors.

According to an aspect of the inventive concept, there is provided a semiconductor device. The semiconductor device may include lower circuit patterns, lower bonding patterns, upper bonding patterns, a passive device, a first wiring, a second wiring, a bit line, a gate electrode structure, a memory channel structure, an upper substrate, and a CSL contact plug. The lower circuit patterns may be formed on a lower substrate. The lower bonding patterns may be formed on the lower circuit patterns, and may include a conductive material and be electrically connected to ones of the lower circuit patterns, respectively. The upper bonding patterns may be formed on and contact the lower bonding patterns, respectively, and may include a conductive material. The passive device may be formed on the upper bonding patterns, and may include a conductive material and contact one of the upper bonding patterns. The first wiring may be formed at the same height as the passive device, and may be spaced apart from the passive device and contact one of the upper bonding patterns. The second wiring may be formed at the same height as the passive device, and may be spaced apart from the passive device and the first wiring, and contact one of the upper bonding patterns. The bit line may be formed on and be electrically connected to the first wiring. The gate electrode structure may be formed on the bit line, and may include gate electrodes spaced apart from each other in a first direction perpendicular to an upper surface of the lower substrate. Each of the gate electrodes may extend in a second direction parallel to the upper surface of the lower substrate, and extension lengths in the second direction of the gate electrodes may increase from a lowermost level toward an uppermost level in a stepwise manner. The a memory channel structure may extend through at least a portion of the gate electrode structure, and may include a filling pattern, a channel on a sidewall of the filling pattern, a charge storage structure on an outer sidewall of the channel, and a capping pattern on lower surfaces of the channel and the filling pattern and contacting an inner sidewall of the charge storage structure. The upper substrate may be formed on the memory channel structure. The CSL contact plug may extend in the first direction from a lower surface of the upper substrate, and may be electrically connected to the second wiring.

According to an aspect of the inventive concept, there is provided a semiconductor device. The semiconductor device may include lower circuit patterns, lower bonding patterns, upper bonding patterns, an active device, a gate electrode structure, a channel, and an upper substrate. The lower circuit patterns may be formed on a lower substrate. The lower bonding patterns may be formed on the lower circuit patterns, and may include a conductive material and be electrically connected to ones of the lower circuit patterns, respectively. The upper bonding patterns may be formed on and contact the lower bonding patterns, respectively, and may include a conductive material. The active device may be formed on the upper bonding patterns, and may contact one of the upper bonding patterns and serve as a memory unit. The gate electrode structure may be formed on the active device, and may include gate electrodes spaced apart from each other in a first direction perpendicular to an upper surface of the lower substrate. Each of the gate electrodes may extend in a second direction parallel to the upper surface of the lower substrate, and extension lengths in the second direction of the gate electrodes may increase from a lowermost level toward an uppermost level in a stepwise manner. The channel may extend through at least a portion of the gate electrode structure. The upper substrate may be formed on the channel.

According to an aspect of the inventive concept, there is provided a massive data storage system. The massive data storage system may include a semiconductor device and a controller. The semiconductor device may have an upper substrate, memory cells under the upper substrate, a passive device under the memory cells, upper bonding patterns under the passive device, lower bonding patterns under and contacting the upper bonding patterns, respectively, lower circuit patterns under and electrically connected to the lower bonding patterns, respectively, a lower substrate under the lower circuit patterns, and an input/output pad electrically connected to the lower circuit patterns. The passive device may contact one of the upper bonding patterns to be electrically connected to one of the lower circuit patterns. The controller may be electrically connected to the semiconductor device through the input/output pad, and may control the semiconductor device.

In the semiconductor device in accordance with example embodiments, a passive device, such as capacitors, is not formed in an additional area, but may rather be formed at the same level as other wirings, so that the integration degree of the semiconductor device may be increased.

BRIEF DESCRIPTION OF THE DRAWINGS

The above and other features of the inventive concept will become more apparent by describing in detail example embodiments thereof with reference to the accompanying drawings, in which:

FIGS. 4 to 23 are plan views and cross-sectional views illustrating a method of manufacturing a vertical memory device in accordance with example embodiments.

DETAILED DESCRIPTION

Figure 1:
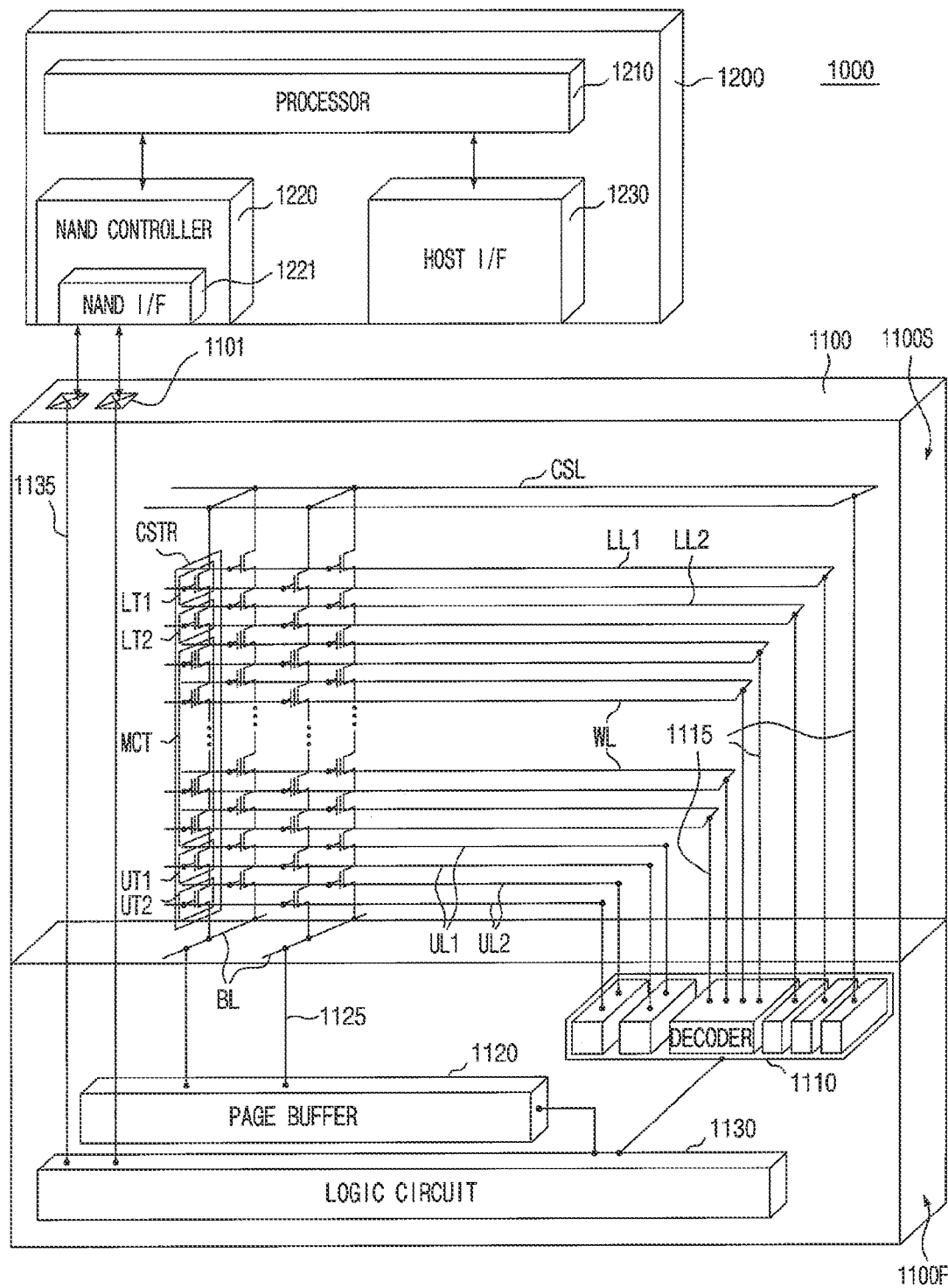
FIG. 1 is a schematic diagram illustrating an electronic system including a semiconductor device in accordance with example embodiments.

The above and other aspects and features of a semiconductor device, methods of manufacturing the same, and an electronic system, e.g., a massive data storage system including the same in accordance with example embodiments, will be described more fully hereinafter with reference to the accompanying drawings. Like reference numerals may refer to like elements throughout the accompanying drawings.

It will be understood that, although the terms "first," "second," "third", etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section described below could be termed a second or third element, component, region, layer or section without departing from the teachings of inventive concept.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to example embodiments, the parameter may be exactly the certain value or approximately the certain value within a measurement error as would be understood by a person having ordinary skill in the art.

It will be further understood that when two components or directions are described as extending substantially parallel or perpendicular to each other, the two components or directions extend exactly parallel or perpendicular to each other, or extend approximately parallel or perpendicular to each other within a measurement error as would be understood by a person having ordinary skill in the art.

FIG. 1 is a schematic diagram illustrating an electronic system including a semiconductor device in accordance with example embodiments.

Referring to FIG. 1, an electronic system 1000 may include a semiconductor device 1100 and a controller 1200 electrically connected to the semiconductor device 1100. The electronic system 1000 may be a storage device including one or a plurality of semiconductor devices 1100 or an electronic device including a storage device. For example, the electronic system 1000 may be a solid state drive (SSD) device, a universal serial bus (USB), a computing system, a medical device, or a communication device that may include one or a plurality of semiconductor devices 1100.

The semiconductor device 1100 may be a non-volatile memory device, for example, a NAND flash memory device that will be described with reference to FIGS. 22 to 29. The semiconductor device 1100 may include a first structure 1100F and a second structure 1100S on the first structure 1100F. The first structure 1100F may be a peripheral circuit structure including a decoder circuit 1110, a page buffer 1120, and a logic circuit 1130. The second structure 1100S may be a memory cell structure including a bit line BL, a common source line CSL, word lines WL, first and second upper gate lines UL1 and UL2, first and second lower gate lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be varied in accordance with example embodiments.

In example embodiments, the upper transistors UT1 and UT2 may include string selection transistors, and the lower transistors LT1 and LT2 may include ground selection transistors. The lower gate lines LL1 and LL2 may be gate electrodes of the lower transistors LT1 and LT2, respectively. The word lines WL may be gate electrodes of the memory cell transistors MCT, respectively, and the upper gate lines UL1 and UL2 may be gate electrodes of the upper transistors UT1 and UT2, respectively.

In example embodiments, the lower transistors LT1 and LT2 may include a lower erase control transistor LT1 and a ground selection transistor LT2 that may be connected with each other in serial. The upper transistors UT1 and UT2 may include a string selection transistor UT1 and an upper erase control transistor UT2. At least one of the lower erase control transistor LT1 and the upper erase control transistor UT2 may be used in an erase operation for erasing data stored in the memory cell transistors MCT through gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 1110 through first connection wirings 1115 extending to the second structure 1110S in the first structure 1100F. The bit lines BL may be electrically connected to the page buffer 1120 through second connection wirings 1125 extending to the second structure 1100S in the first structure 1100F.

In the first structure 1100F, the decoder circuit 1110 and the page buffer 1120 may perform a control operation for at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output connection wiring 1135 extending to the second structure 1100S in the first structure 1100F.

The controller 1200 may include a processor 1210, a NAND controller 1220, and a host interface 1230. The electronic system 1000 may include a plurality of semiconductor devices 1100, and in this case, the controller 1200 may control the plurality of semiconductor devices 1100.

The processor 1210 may control operations of the electronic system 1000 including the controller 1200. The processor 1210 may be operated by firmware, and may control the NAND controller 1220 to access the semiconductor device 1100. The NAND controller 1220 may include a NAND interface 1221 for communicating with the semiconductor device 1100. Through the NAND interface 1221, a control command for controlling the semiconductor device 1100, data to be written in the memory cell transistors MCT of the semiconductor device 1100, data to be read from the memory cell transistors MCT of the semiconductor device 1100, etc., may be transferred. The host interface 1230 may enable communication between the electronic system 1000 and an outside host (e.g., a host disposed external to the electronic system 1000). When a control command is received from the outside host through the host interface 1230, the processor 1210 may control the semiconductor device 1100 in response to the control command.

Figure 2:
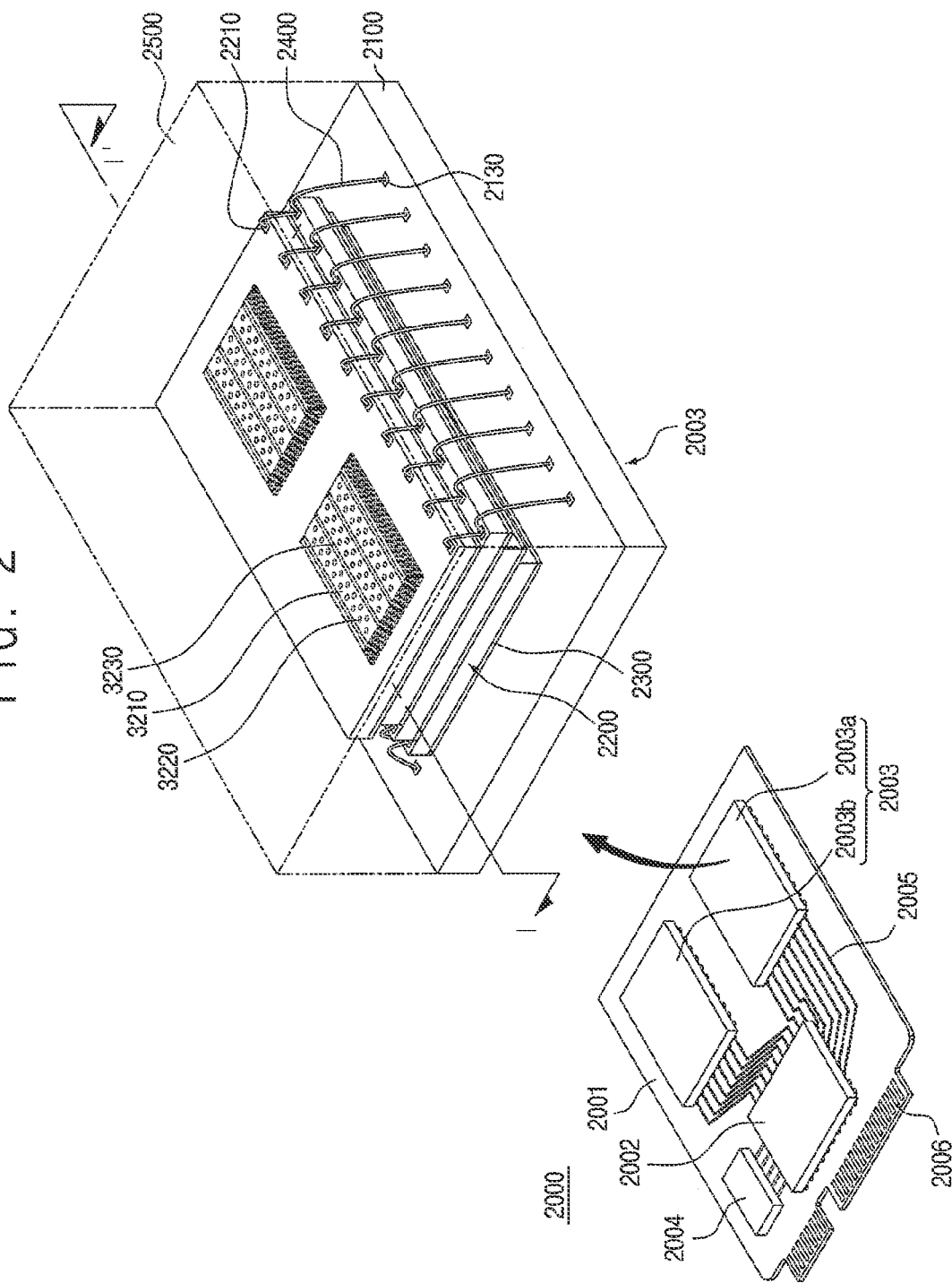
FIG. 2 is a schematic perspective view illustrating an electronic system including a semiconductor device in accordance with example embodiments.

FIG. 2 is a schematic perspective view illustrating an electronic system including a semiconductor device in accordance with example embodiments.

Referring to FIG. 2, an electronic system 2000 may include a main substrate 2001, a controller 2002 mounted on the main substrate 2001, at least one semiconductor package 2003, and a dynamic random access memory (DRAM) device 2004. The semiconductor package 2003 and the DRAM device 2004 may be connected to the controller 2002 by wiring patterns 2005 on the main substrate 2001.

The main substrate 2001 may include a connector 2006 having a plurality of pins connected to an outside host. The number and layout of the plurality pins in the connector 2006 may be changed depending on the communication interface between the electronic system 2000 and the outside host. In example embodiments, the electronic system 2000 may communicate with the outside host according to one of a USB, peripheral component interconnect express (PCI-Express), serial advanced technology attachment (SATA), M-Phy for universal flash storage (UFS), etc. interface. In example embodiments, the electronic system 2000 may be operated by power source provided from the outside host through the connector 2006. The electronic system 2000 may further include a power management integrated circuit (PMIC) for distributing the power source provided from the outside host to the controller 2002 and the semiconductor package 2003.

The controller 2002 may write data in the semiconductor package 2003 or read data from the semiconductor package 2003, and may increase the operation speed of the electronic system 2000.

The DRAM device 2004 may be a buffer memory for reducing the speed difference between the semiconductor package 2003 that stores data and the outside host. The DRAM device 2004 included in the electronic system 2000 may serve as a cache memory, and may provide a space for temporarily storing data during the control operation for the semiconductor package 2003. If the electronic system 2000 includes the DRAM device 2004, the controller 2002 may further include a DRAM controller for controlling the DRAM device 2004 in addition to the NAND controller for controlling the semiconductor package 2003.

The semiconductor package 2003 may include first and second semiconductor packages 2003*a* and 2003*b* spaced apart from each other. The first and second semiconductor packages 2003*a* and 2003*b* may each include a plurality of semiconductor chips 2200. Each of the first and second semiconductor packages 2003*a* and 2003*b* may include a package substrate 2100, the semiconductor chips 2200, bonding layers 2300 disposed under the semiconductor chips 2200, a connection structure 2400 that electrically connects the semiconductor chips 2200 and the package substrate 2100, and a mold layer 2500 covering the semiconductor chips 2200 and the connection structure 2400 on the package substrate 2100.

The package substrate 2100 may be a printed circuit board (PCB) including package upper pads 2130. Each semiconductor chip 2200 may include an input/output pad 2210. The input/output pad 2210 may correspond to the input/output pad 1101 of FIG. 1. Each semiconductor chip 2200 may include gate electrode structures 3210, memory channel structures 3220 extending through the gate electrode structures 3210, and division structures 3230 that divide the gate electrode structures 3210. Each semiconductor chip 2200 may include a semiconductor device that will be described with reference to FIGS. 22 to 29.

In example embodiments, the connection structure 2400 may be a bonding wire for electrically connecting the input/output pad 2210 and the package upper pads 2130. Thus, in an example embodiment, in each of the first and second semiconductor packages 2003*a* and 2003*b*, the semiconductor chips 2200 may be electrically connected with each other by a bonding wire method, and may be electrically connected to the package upper pads 2130 of the package substrate 2100. Alternatively, in an example embodiment, in each of the first and second semiconductor packages 2003*a* and 2003*b*, the semiconductor chips 2200 may be electrically connected with each other by a connection structure including a through silicon via (TSV) instead of the connection structure 2400 of the bonding wire method.

In example embodiments, the controller 2002 and the semiconductor chips 2200 may be included in one package. In example embodiments, the controller 2002 and the semiconductor chips 2200 may be mounted on an interposer substrate different from the main substrate 2001, and the controller 2002 and the semiconductor chips 2200 may be connected with each other by a wiring on the interposer substrate.

Figure 3:
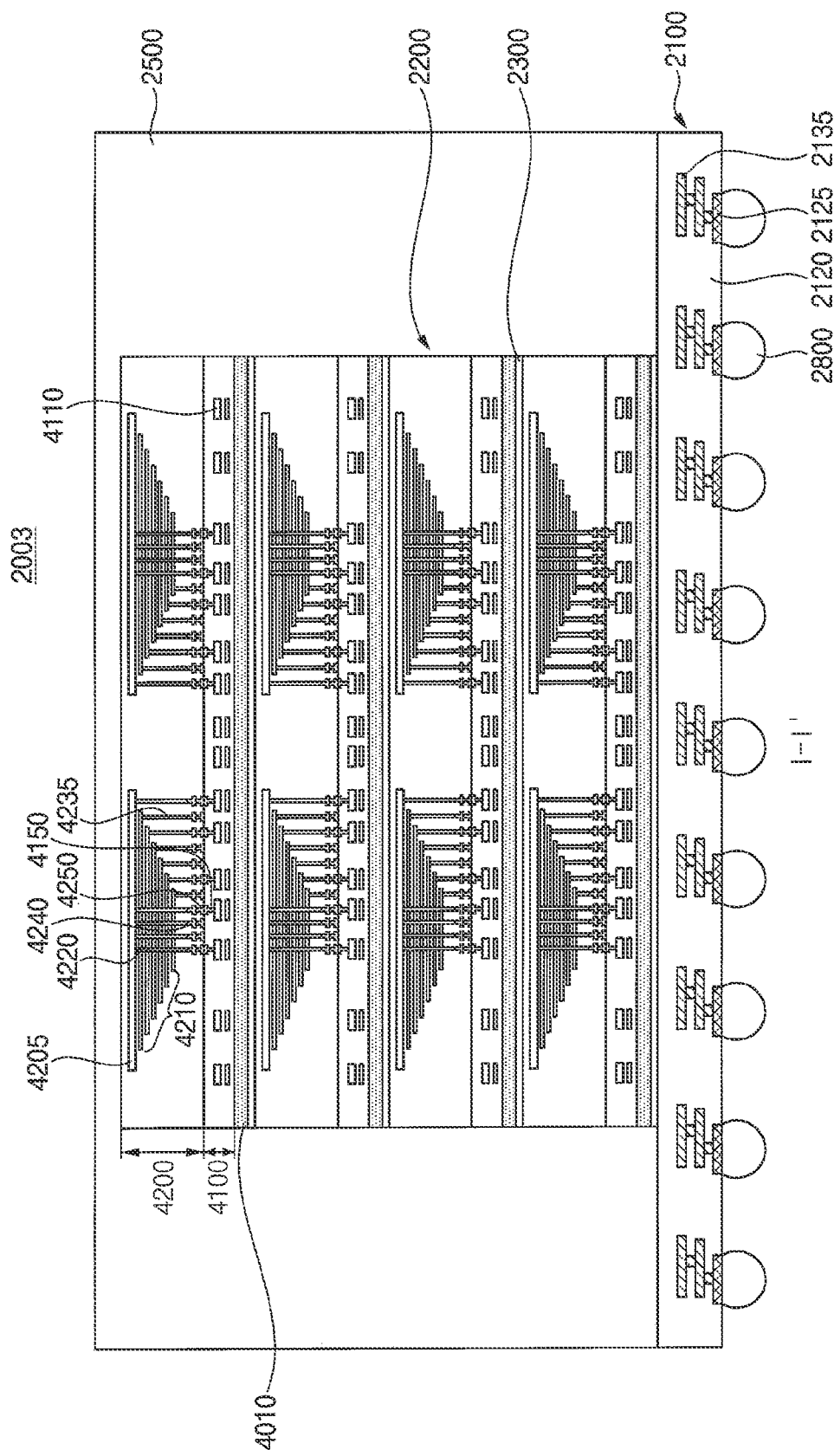
FIG. 3 is a schematic cross-sectional view illustrating a semiconductor package that includes a semiconductor device in accordance with example embodiments.

FIG. 3 is a schematic cross-sectional view illustrating a semiconductor package that may include a semiconductor device in accordance with example embodiments. FIG. 3 illustrates example embodiments of the semiconductor package 2003 shown in FIG. 2, and shows a cross-section taken along line I-I' of the semiconductor package 2003 in FIG. 2.

Referring to FIG. 3, in the semiconductor package 2003, the package substrate 2100 may be a PCB. The package substrate 2100 may include a substrate body part 2120, upper pads 2130 (refer to FIG. 2) on an upper surface of the substrate body part 2120, lower pads 2125 on a lower surface of the substrate body part 2120 or exposed through the lower surface of the substrate body part 2120, and inner wirings 2135 for electrically connecting the upper pads 2130 and the lower pads 2125 in an inside of the substrate body part 2120. The upper pads 2130 may be electrically connected to the connection structures 2400. The lower pads 2125 may be connected to wiring patterns 2005 of the main substrate 2010 in the electronic system 2000 through conductive connection parts 2800, as shown in FIG. 2.

Each semiconductor chip 2200 may include a semiconductor substrate 4010, a first structure 4100 on the semiconductor substrate 4010, and a second structure 3200 on and bonded with the first structure 4100 by a wafer bonding method. The first structure 4100 may include a peripheral circuit region in which peripheral circuit wirings 4110 and first bonding structures 4150 may be formed. The second structure 4200 may include a common source line 4205, a gate electrode structure 4210 between the common source line 4205 and the first structure 4100, memory channel structures 4220 and the division structure 3230 (refer to FIG. 2) extending through the gate electrode structure 4210, and second bonding structures 4250 electrically connected to the memory channel structures 4220 and the word lines WL (refer to FIG. 1) of the gate electrode structure 4210. For example, the second bonding structures 4250 may be electrically connected to the memory channel structures 4220 and the word lines WL (refer to FIG. 1) through the bit lines 4240 electrically connected to the memory channel structures 4220 and the gate connection wirings 4235 electrically connected to the word lines WL (refer to FIG. 1), respectively. The first bonding structures 4150 of the first structure 4100 and the second bonding structures 4250 of the second structure 4200 may contact each other to be bonded with each other. The first bonding structures 4150 and the second bonding structures 4250 may include, e.g., copper. The second structure 4200 may further include the first conductive patterns 492 and/or the second conductive pattern 493 shown in FIGS. 22 to 29.

Each semiconductor chip 2200a may further include the input/output pad 2210 (refer to FIG. 2) electrically connected to the peripheral circuit wirings 4110 of the first structure 4100.

The semiconductor chips 2200 of FIG. 3 may be electrically connected with each other by the connection structures 2400 in a bonding wire method. However, in example embodiments, semiconductor chips such as the semiconductor chips 2200 of FIG. 3 in the same semiconductor package may be electrically connected with each other by a connection structure including a TSV.

Figure 20:
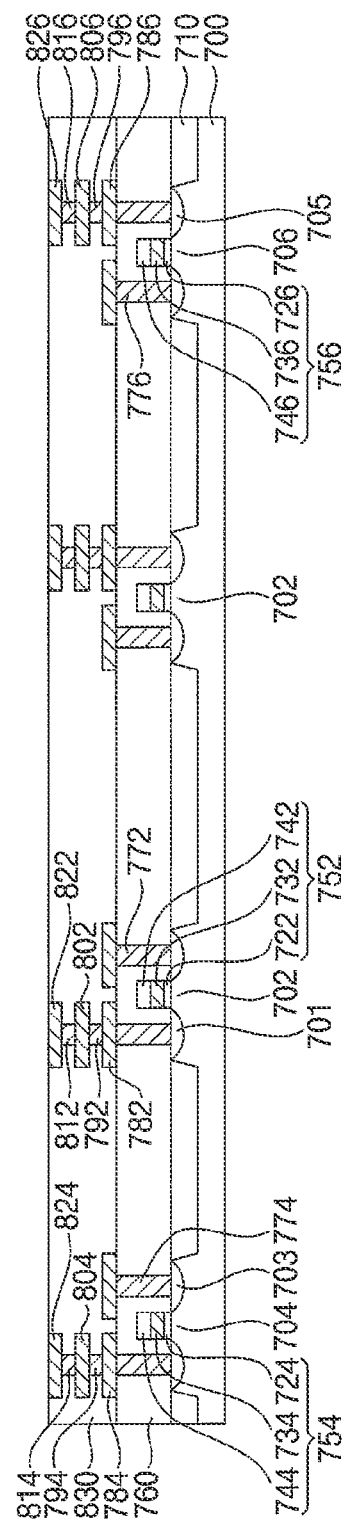
Figure 21:
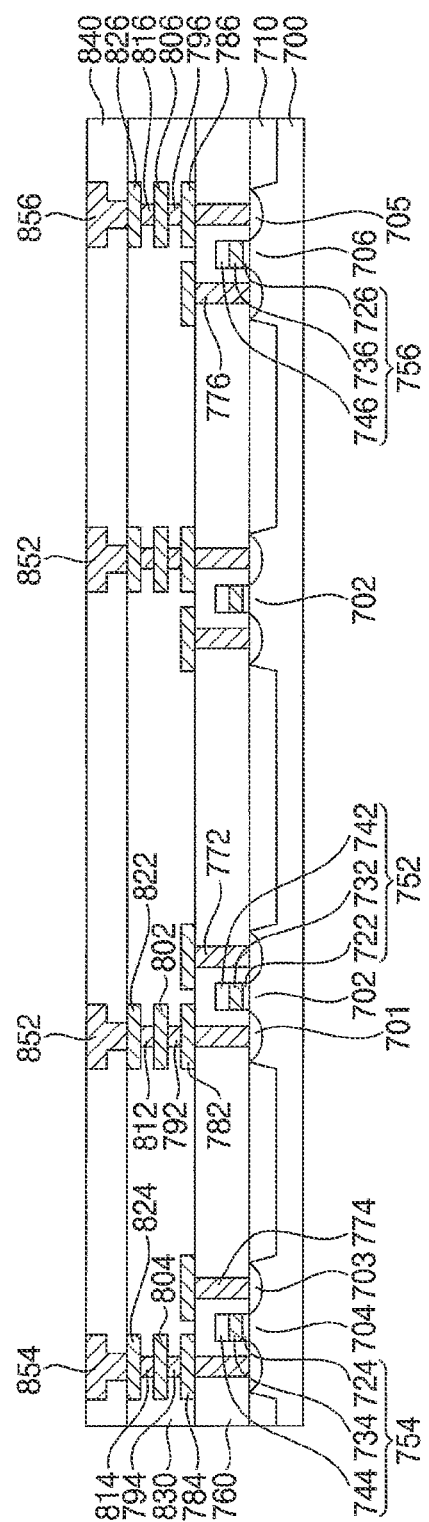

FIGS. 4 to 23 are plan views and cross-sectional views illustrating a method of manufacturing a vertical memory device in accordance with example embodiments. For example, FIGS. 5, 8, 11-14, 16, 18 and 22 are cross-sectional views taken along lines A-A', respectively, of corresponding plan views, and FIGS. 6, 9, 17, 19 and 23 are cross-sectional views taken along lines B-B', respectively, of corresponding plan views. FIGS. 20 and 21 are cross-sectional views of a second substrate.

This semiconductor device may correspond to the semiconductor device 1100 of FIG. 1 and the semiconductor chips 2200 of FIGS. 2 and 3.

Hereinafter, a direction substantially perpendicular to an upper surface of a first substrate may be defined as a first direction D1, and two directions substantially parallel to the upper surface of the first substrate and crossing each other may be defined as second and third directions D2 and D3, respectively. In example embodiments, the second and third directions D2 and D3 may be substantially perpendicular to each other.

Figure 5:
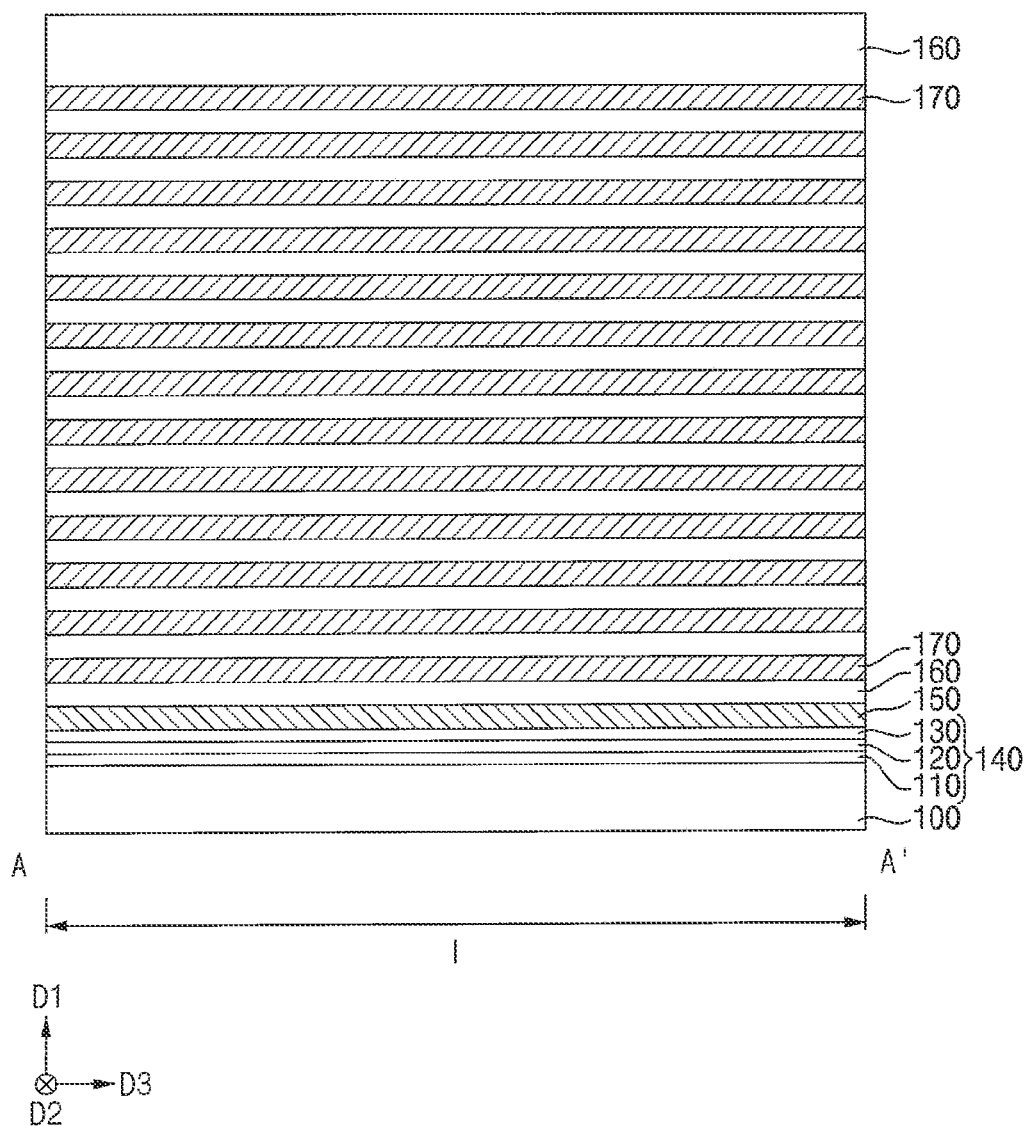
Figure 6:
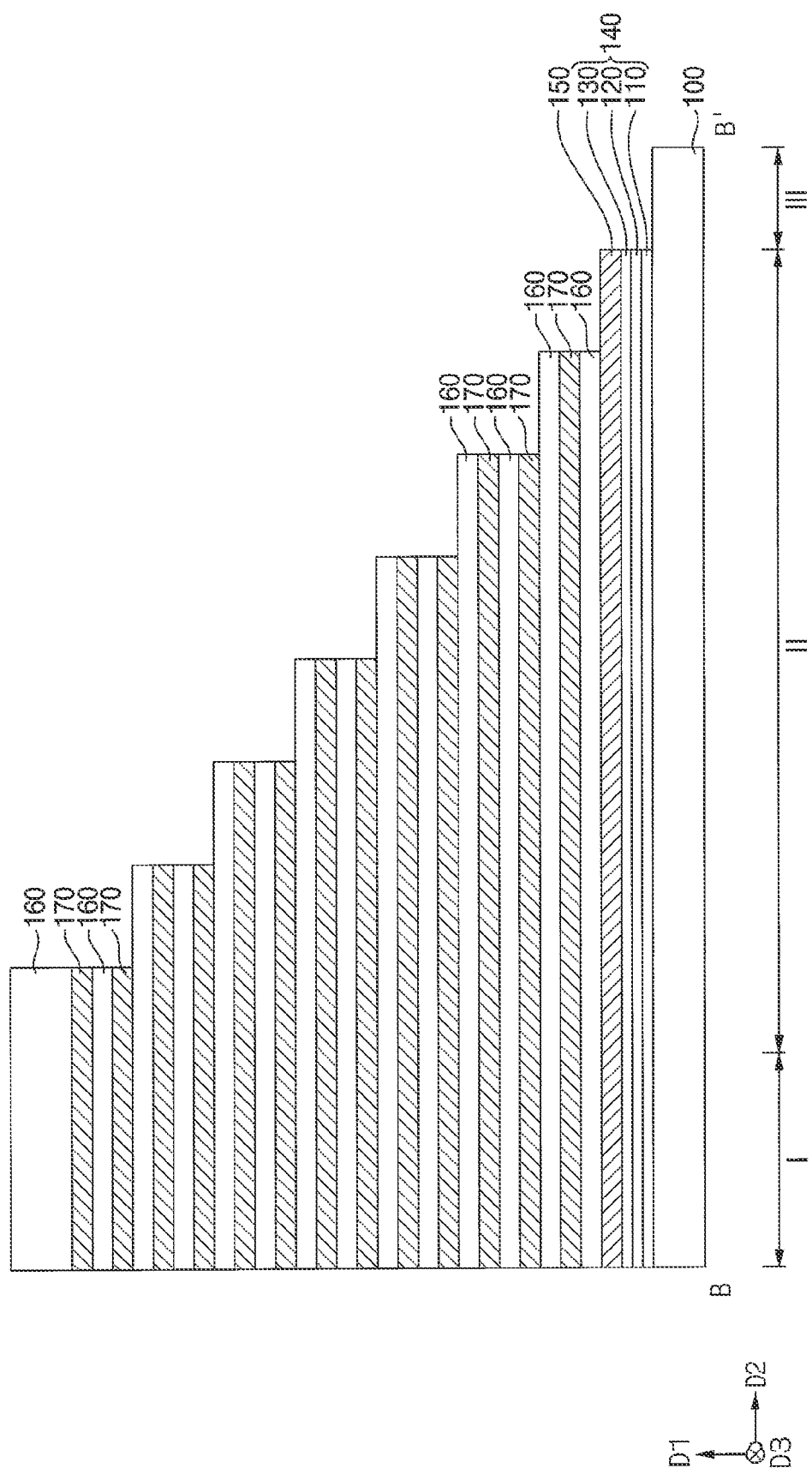

Referring to FIGS. 4 to 6, a sacrificial layer structure 140 and a support layer 150 may be formed on a first substrate 100, and an insulation layer 160 and a fourth sacrificial layer 170 may be alternately and repeatedly stacked on the support layer 150 to form a mold layer.

The first substrate 100 may include, for example, silicon, germanium, silicon-germanium or a III-V compound such as GaP, GaAs, GaSb, etc. In some embodiments, the first substrate 100 may be a silicon-on-insulator (SOI) substrate or a germanium-on-insulator (GOI) substrate.

In example embodiments, n-type impurities, e.g., phosphorus, arsenic, etc., may be doped into the first substrate 100, and thus, the first substrate 100 may serve as a common source plate corresponding to the common source line (CSL) shown in the first substrate 100.

The first substrate 100 may include first, second and third regions I, II and III. The first region I may be a cell array region in which memory cells may be formed, and the second region II may at least partially surround the first region I and may be a pad region or extension region in which contact plugs for transferring electrical signals to the memory cells may be formed. The third region III may at least partially surround the second region II, and may be a peripheral circuit region in which peripheral circuits for applying electrical signals to the memory cells may be formed.

The sacrificial layer structure 140 may include first, second and third sacrificial layers 110, 120 and 130 sequentially stacked in the first direction D1. The first and third sacrificial layers 110 and 130 may include an oxide, e.g., silicon oxide, and the second sacrificial layer 120 may include a nitride, e.g., silicon nitride. A first recess extending through the sacrificial layer structure 140 that exposes an upper surface of the first substrate 100 may be formed.

The support layer 150 may include a material having an etching selectivity with respect to the first to third sacrificial layers 110, 120 and 130, e.g., polysilicon doped with n-type impurities. In some embodiments, the support layer 150 may be formed by depositing amorphous silicon doped with n-type impurities, and crystallizing the amorphous silicon by a heat treatment process or by subsequent deposition processes of other layers so that the support layer 150 may include polysilicon doped with n-type impurities.

The support layer 150 may have a uniform thickness on the sacrificial layer structure 140 and the upper surface of the first substrate 100 exposed by the first recess, and a portion of the support layer 150 in the first recess may be referred to as a support pattern.

The insulation layer 160 may include an oxide, e.g., silicon oxide, and the fourth sacrificial layer 170 may include a material having an etching selectivity with respect to the insulation layer 160, e.g., a nitride such as silicon nitride.

FIG. 5 shows the mold layer including the insulation layers 160 and the fourth sacrificial layers 170 stacked at 14 levels and 13 levels, respectively. However, embodiments of the inventive concept are not limited thereto. For example, in some embodiments, the insulation layers 160 and the fourth sacrificial layers 170 may be stacked at more than 14 levels and 13 levels, respectively.

A photoresist layer may be formed on an uppermost one of the insulation layers 160 and a photo process may be performed on the photoresist layer to form a photoresist pattern. The uppermost one of the insulation layers 160 and an uppermost one of the fourth sacrificial layers 170 may be etched using the photoresist pattern as an etching mask. Thus, one of the insulation layers 160 directly under the uppermost one of the fourth sacrificial layers 170 may be partially exposed. A trimming process in which an area of the photoresist pattern is reduced by a given ratio may be performed, and the uppermost one of the insulation layers 160, the uppermost one of the fourth sacrificial layers 170, the exposed one of the insulation layers 160, and one of the fourth sacrificial layers 170 directly under the exposed one of the insulation layers 160 may be etched using the photoresist pattern having the reduced area.

The trimming process and the etching process may be alternately and repeatedly performed to form a mold having a staircase shape including a plurality of step layers, each of which may include one fourth sacrificial layer 170 and one insulation layer 160 sequentially stacked in the first and second regions I and II of the first substrate 100. In some embodiments, an end portion in the second direction D2 of each of the step layers is not overlapped with upper step layers in the first direction D1 to be exposed, which may be referred to as a "step." In example embodiments, the steps of the mold may be formed in the second region II of the first substrate 100, and may be disposed in each of the second direction D2 and/or third direction D3.

In some embodiments, a portion of the support layer 150 is not covered by the mold, but rather, may be exposed.

Figure 7:
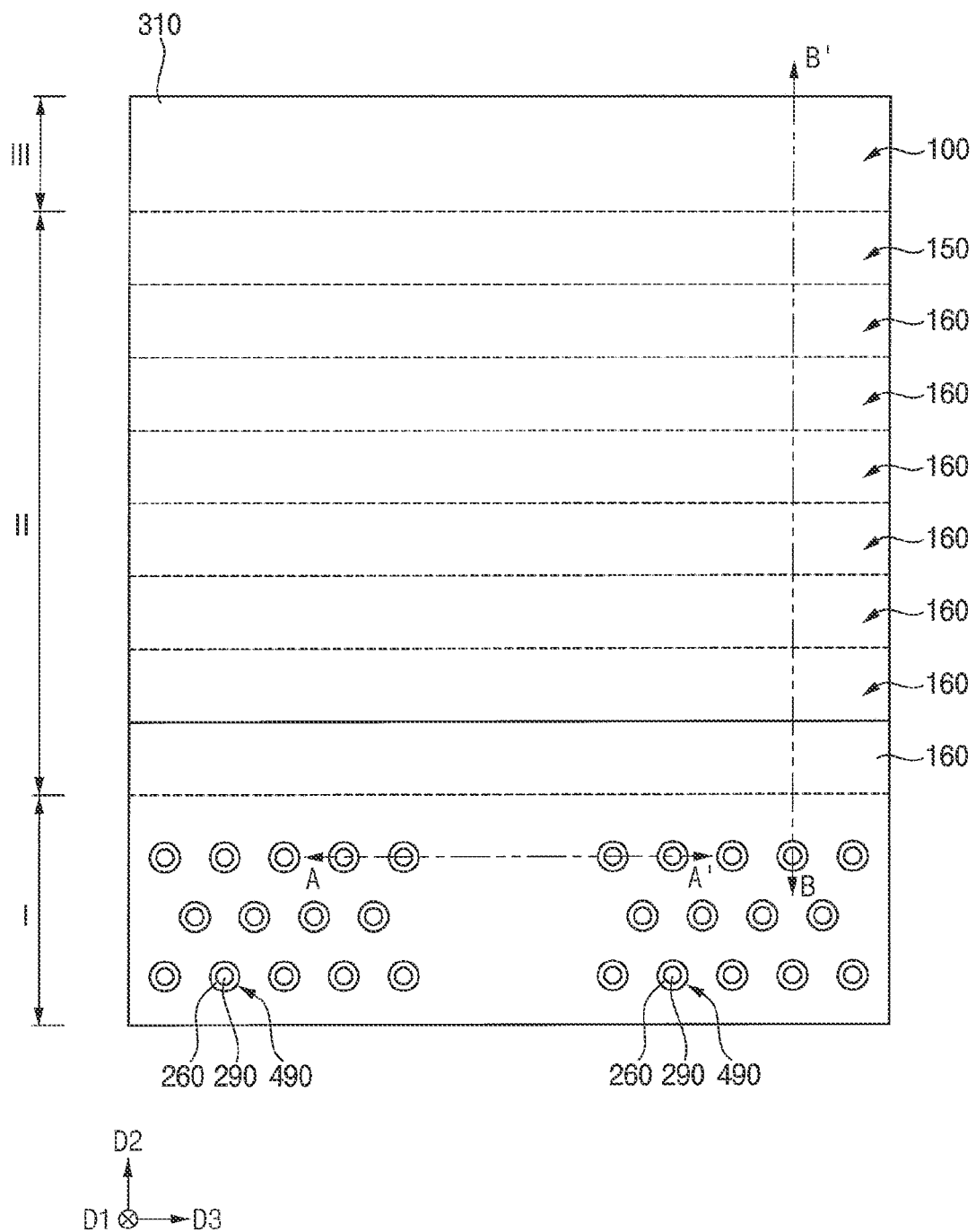
Figure 8:
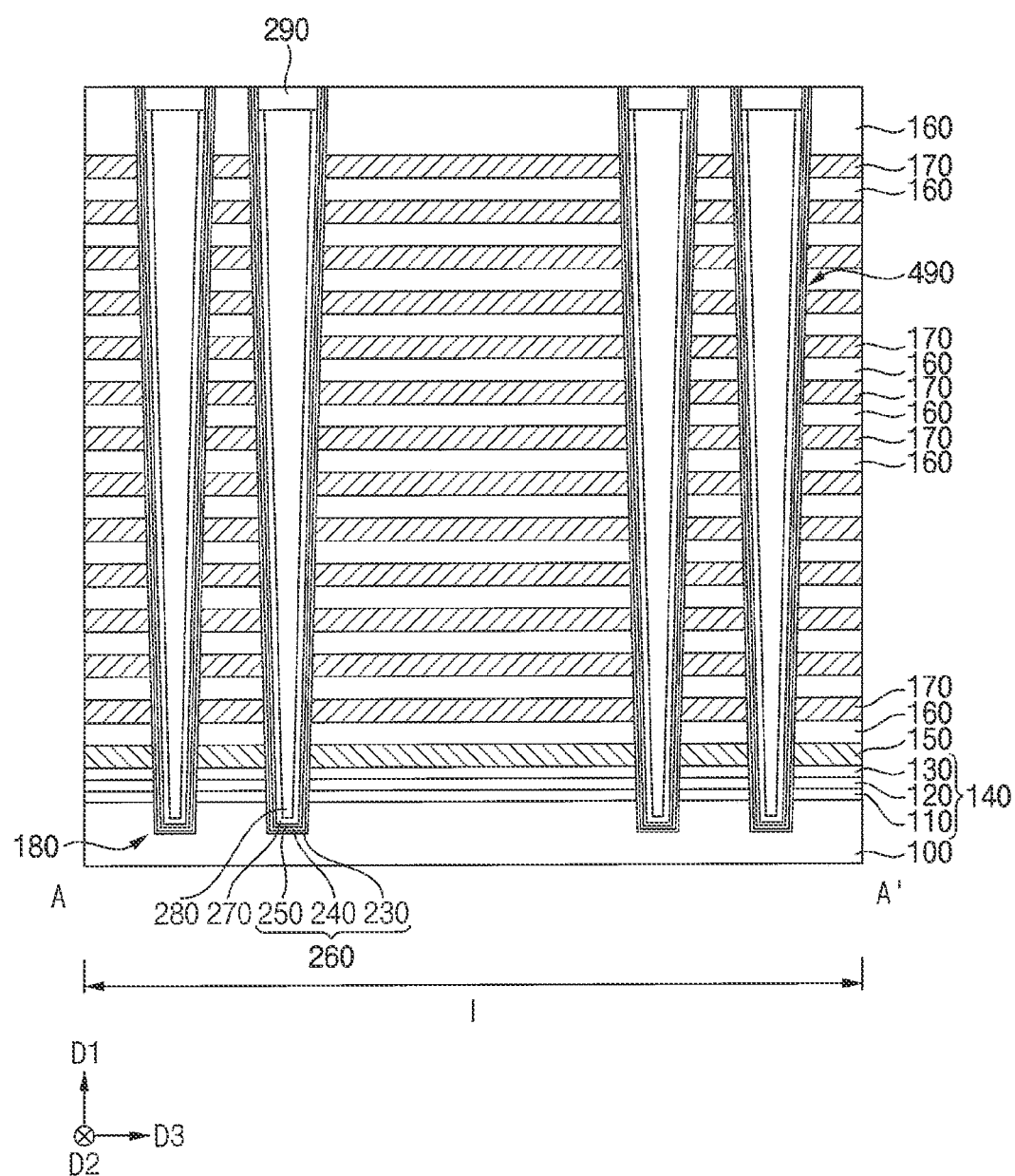
Figure 9:
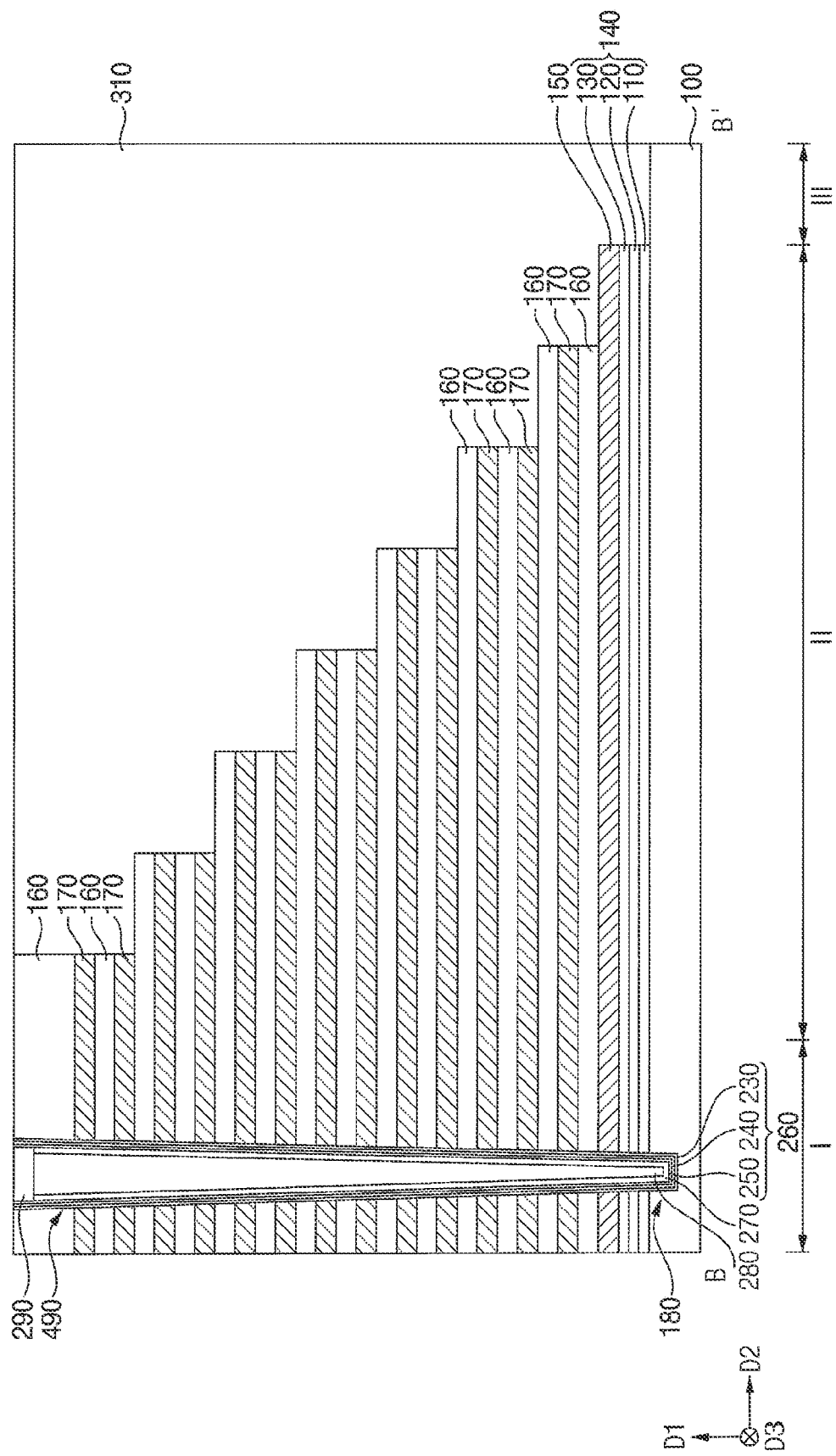

Referring to FIGS. 7 to 9, a first insulating interlayer 310 may be formed on the first substrate 100 to cover the mold, the support layer 150 and the sacrificial layer structure 140, and may be planarized until an upper surface of the uppermost one of the insulation layers 160 of the mold is exposed. Thus, a sidewall of the mold, an upper surface and a sidewall of the support layer 150, and a sidewall of the sacrificial layer structure 140 may be covered by the first insulating interlayer 310.

A channel hole 180 may be formed through the mold, the support layer 150 and the sacrificial layer structure 140 to expose an upper surface of the first substrate 100. A charge storage structure layer may be formed on a sidewall of the channel hole 180, the upper surface of the first substrate 100 exposed by the channel hole 180, the uppermost one of the insulation layers 160 in the mold, and the first insulating interlayer 310. A channel layer may be formed on the charge storage structure layer, and a filling layer may be formed on the channel layer to fill the channel hole 180.

The channel layer may include, e.g., polysilicon, and the filling layer may include an oxide, e.g., silicon oxide. The charge storage structure layer may include a first blocking layer, a charge storage layer and a tunnel insulation layer sequentially stacked from an inner wall of the channel hole 180. For example, the first blocking layer, the charge storage layer and the tunnel insulation layer may include an oxide, e.g., silicon oxide, a nitride, e.g., silicon nitride, and an oxide, e.g., silicon oxide, respectively.

The filling layer, the channel layer and the charge storage structure layer may be planarized until the upper surface of the uppermost surface of the insulation layers 160 in the mold is exposed, so that a filling pattern 280, a channel 270 and a charge storage structure 260 may be formed in the channel hole 180. The charge storage structure 260 may include a first blocking pattern 230, a charge storage pattern 240 and a tunnel insulation pattern 250 sequentially stacked from the inner wall of the channel hole 180 and the upper surface of the first substrate 100.

In example embodiments, the filling pattern 280 may have a pillar shape extending in the first direction D1, the channel 270 may have a cup-like shape covering a sidewall and a lower surface of the filling pattern 280, and the charge storage structure 260 may have a cup-like shape covering an outer sidewall and a lower surface of the channel 270.

Upper portions of the filling pattern 280 and the channel 270 may be removed to form a trench, and a capping pattern 290 may be formed to fill the trench. In example embodiments, the capping pattern 290 may include, e.g., polysilicon doped with impurities or amorphous silicon doped with impurities, and in embodiments in which the capping pattern 290 includes amorphous silicon doped with impurities, a crystallization process may be further performed.

The filling pattern 280, the channel 270, the charge storage structure 260 and the capping pattern 290 may form a memory channel structure 490 having a pillar shape, which may correspond to the memory channel structures 3220 and 4220 shown in FIGS. 2 and 3. In example embodiments, a plurality of memory channel structures 490 may be spaced apart from each other in each of the second and third directions D2 and D3. Additionally, each of the memory channel structures 490 may have a width gradually decreasing from a top toward a bottom thereof.

Figure 10:
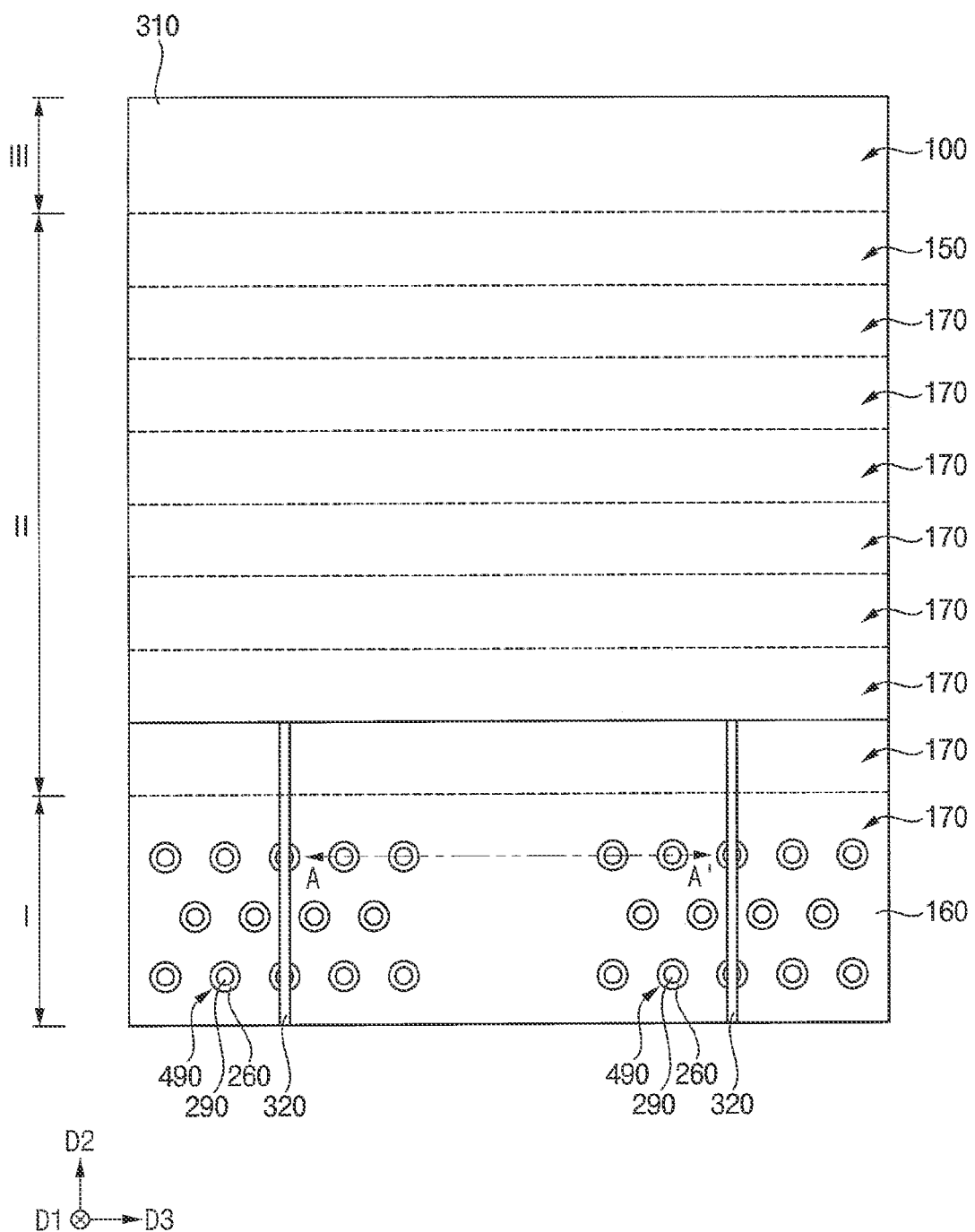

Referring to FIG. 10, the first insulating interlayer 310 and some of the insulation layers 160 and the fourth sacrificial layers 170 may be etched to form a first opening extending in the second direction D2, and a first division pattern 320 may be formed in the first opening.

The first division pattern 320 may extend in the second direction D2 in the first and second regions I and II of the first substrate 100, and may extend through, e.g., upper two steps of the mold. Thus, the fourth sacrificial layers 170 at two upper levels of the mold may be divided in the third direction D3 by the first division pattern 320. In an example embodiment, the first division pattern 320 may extend through upper portions of some of the memory channel structures 490.

The first division pattern 320 may include an oxide, e.g., silicon oxide or a nitride, e.g., silicon nitride.

Figure 11:
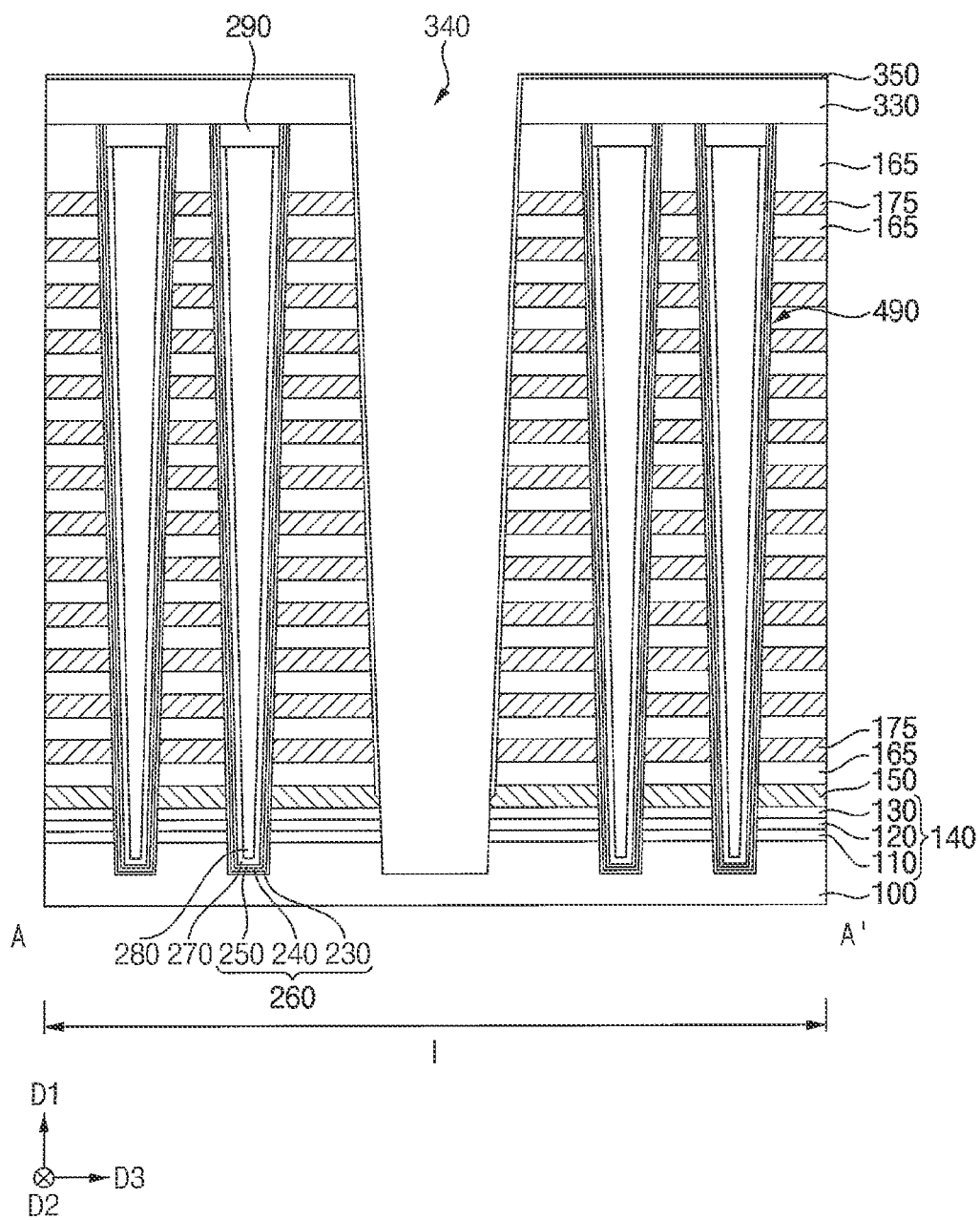

Referring to FIG. 11, a second insulating interlayer 330 may be formed on the first insulating interlayer 310 and the first division pattern 320, and a second opening 340 may be formed through the first and second insulating interlayers 310 and 330 and the mold by, e.g., a dry etching process.

In example embodiments, the dry etching process may be performed until an upper surface of the support layer 150 or an upper surface of the support pattern is exposed, and an upper portion of the support layer 150 or an upper portion of the support pattern may be also removed during the dry etching process. In example embodiments, the second opening 340 may extend in the second direction D2 in the first and second regions I and II of the first substrate 100, and a plurality of second openings 340 may be formed in the third direction D3. As the second opening 340 is formed, the insulation layer 160 and the fourth sacrificial layer 170 of the mold may be divided into insulation patterns 165 and fourth sacrificial patterns 175 each of which may extend in the second direction D2.

A spacer layer may be formed on a sidewall of the second opening 340 and the second insulating interlayer 330, and may be anisotropically etched so that a portion of the spacer layer on a bottom of the second opening 340 may be removed to form a spacer 350. Thus, the support layer 150 and the support pattern may be partially exposed.

The exposed support layer 150 and the support pattern and a portion of the sacrificial layer structure 140 thereunder may be removed to enlarge the second opening 340 downwardly. Accordingly, the second opening 340 may expose an upper surface of the first substrate 100, and further extend through an upper portion of the first substrate 100.

In example embodiments, the spacer 350 may include, e.g., undoped amorphous silicon or undoped polysilicon. If the spacer 350 includes undoped amorphous silicon, the spacer 350 may be crystallized by heat generated during deposition processes of other layers, so as to include undoped polysilicon.

When the sacrificial layer structure 140 is partially removed, the sidewall of the second opening 340 may be covered by the spacer 350, and thus, in example embodiments, the insulation pattern 165 and the fourth sacrificial pattern 175 included in the mold are not removed.

Figure 12:
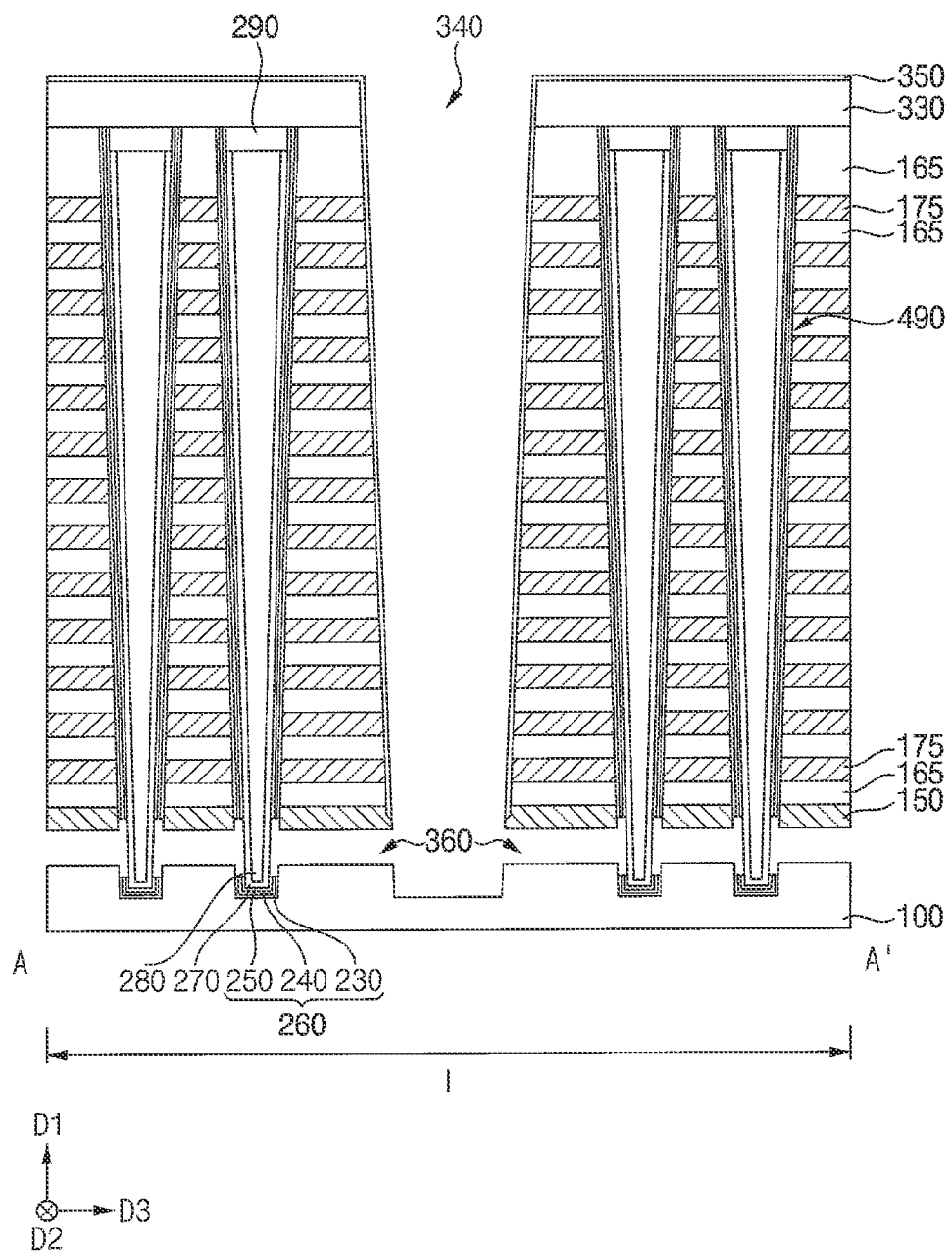

Referring to FIG. 12, the sacrificial layer structure 140 exposed by the second opening 340 may be removed by, e.g., a wet etching process to form a first gap 360.

The wet etching process may be performed using, e.g., hydrofluoric acid or phosphoric acid.

As the first gap 360 is formed, a lower portion of the support layer 150 and an upper portion of the first substrate 100 adjacent to the second opening 340 may be exposed. Additionally, a sidewall of the charge storage structure 260 may be partially exposed by the first gap 360, and the exposed sidewall of the charge storage structure 260 may also be removed to expose an outer sidewall of the channel 270. Accordingly, the charge storage structure 260 may be divided into an upper portion extending through the mold to cover a portion of the outer sidewall of the channel 270 and a lower portion covering a lower surface of the channel 270 on the first substrate 100.

In example embodiments, when the first gap 360 is formed by the wet etching process, the support layer 150 and the support pattern are not removed, and thus, the mold does not lean or collapse.

Figure 13:
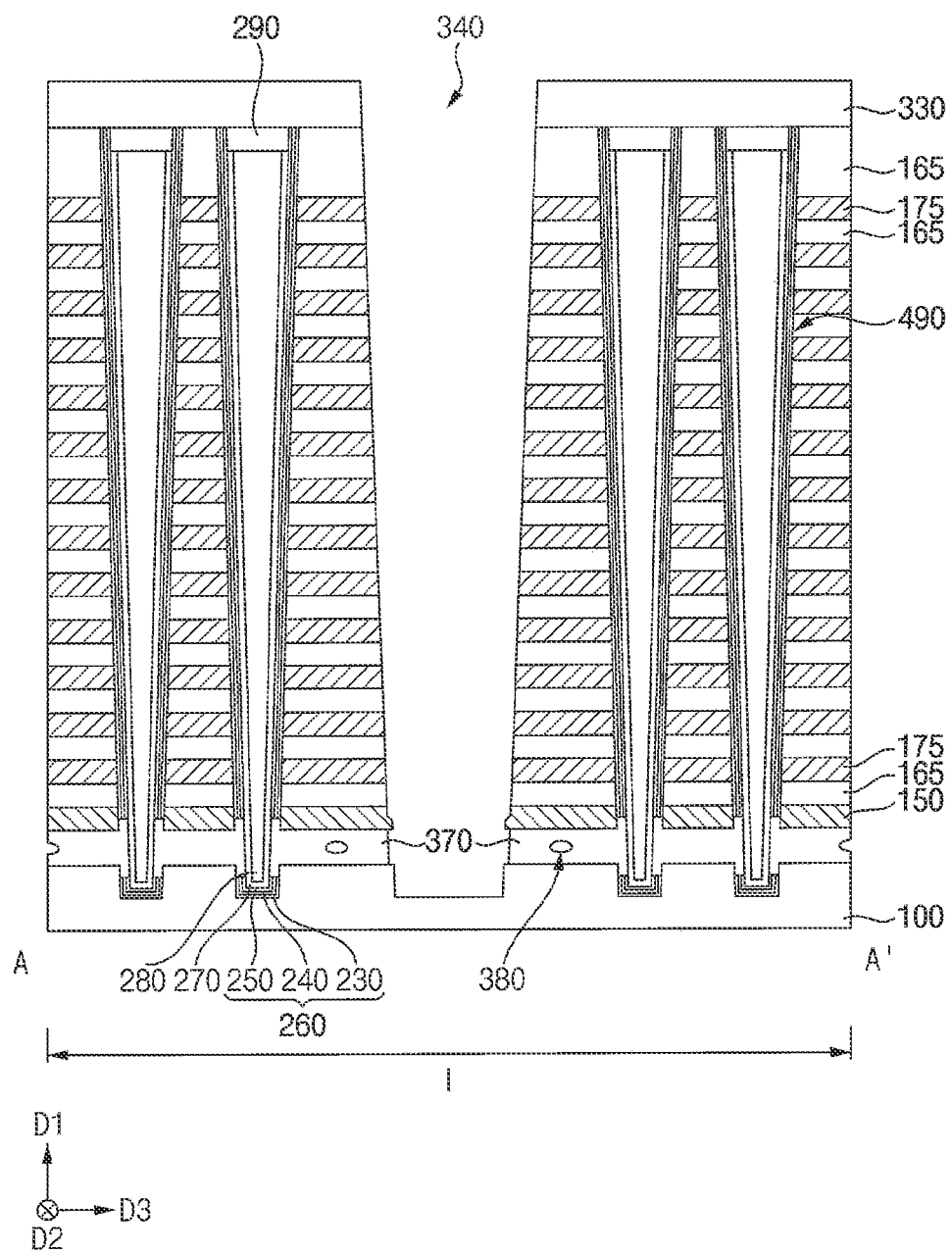

Referring to FIG. 13, after removing the spacer 350, a channel connection layer may be formed on the sidewall of the second opening 340 and in the first gap 360, and a portion of the channel connection layer in the second opening 340 may be removed to form a channel connection pattern 370 in the first gap 360.

As the channel connection pattern 370 is formed, the channels 270 between neighboring ones of the second openings 340 in the third direction D3 may be connected with each other.

The channel connection pattern 370 may include, e.g., amorphous silicon doped with n-type impurities, and may be crystallized later during other deposition processes so as to include polysilicon doped with n-type impurities.

An air gap 380 may be formed in the channel connection pattern 370.

Figure 14:
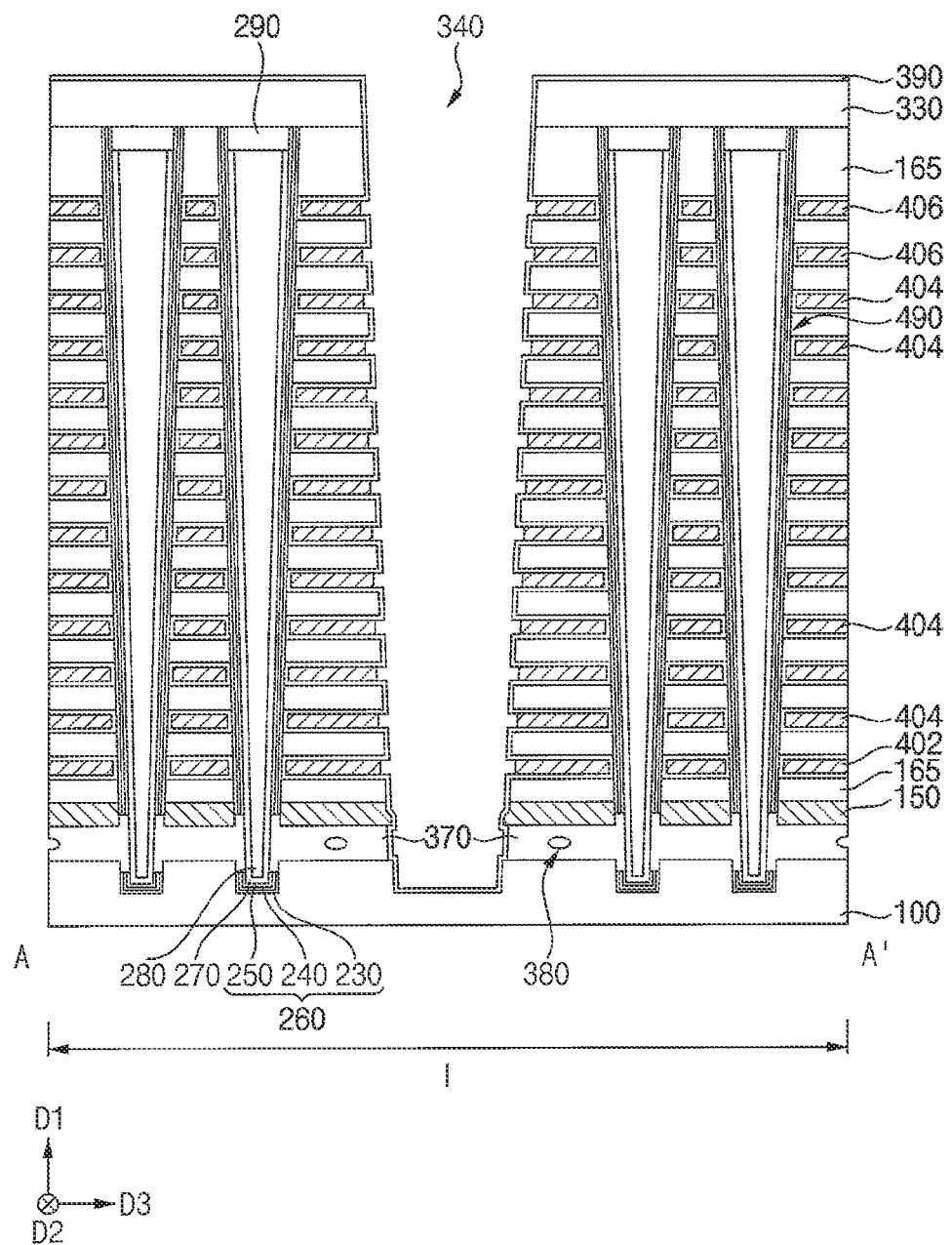

Referring to FIG. 14, the fourth sacrificial patterns 175 exposed by the second opening 340 may be removed to form a second gap between the insulation patterns 165, and an outer sidewall of the first blocking pattern 230 may be partially exposed by the second gap.

In example embodiments, the fourth sacrificial patterns 175 may be removed by a wet etching process using, e.g., phosphoric acid ($H_3PO_4$) or sulfuric acid ($H_2SO_4$).

A second blocking layer 390 may be formed on the exposed outer sidewall of the first blocking pattern 230, inner walls of the second gaps, surfaces of the insulation patterns 165, a sidewall and an upper surface of the support layer 150, a sidewall of the support pattern, a sidewall of the channel connection pattern 370, the upper surface of the first substrate 100, and an upper surface of the second insulating interlayer 330, and a gate electrode layer may be formed on the second blocking layer 390.

In example embodiments, the second blocking layer 390 may include a metal oxide, e.g., aluminum oxide, hafnium oxide, zirconium oxide, etc. The gate electrode layer may include a gate barrier layer and a gate conductive layer sequentially stacked. The gate electrode layer may include a low resistance metal, e.g., tungsten, titanium, tantalum, platinum, etc., and the gate barrier layer may include a metal nitride, e.g., titanium nitride, tantalum nitride, etc.

The gate electrode layer may be partially removed to form a gate electrode in each of the second gaps. In example embodiments, the gate electrode layer may be partially removed by a wet etching process.

In example embodiments, the gate electrode may extend in the second direction D2, and a plurality of gate electrodes may be spaced apart from each other in the first direction D1 to form a gate electrode structure. The gate electrodes may be stacked in a staircase shape in which extension lengths in the second direction D2 decrease in a stepwise manner from a lowermost level toward an uppermost level. Additionally, a plurality of gate electrode structures may be formed in the third direction D3. That is, the gate electrode structures may be spaced apart from each other in the third direction D3 by the second opening 340.

In example embodiments, the gate electrode structure may include first, second and third gate electrodes 402, 404 and 406 sequentially stacked in the first direction D1. Additionally, a fourth gate electrode may be further formed at levels above the third gate electrode 406 or below the first gate electrode 402, and may perform body erase using a GIDL phenomenon. The gate electrode structure may correspond to the gate electrode structures 3210 and 4210 shown in FIGS. 2 and 3.

In example embodiments, the first gate electrode 402 may serve as a ground selection line (GSL), and the third gate electrode 406 may serve as a string selection line (SSL). In FIG. 14, the first gate electrode 402 is formed at a lowermost level, and the third gate electrode 406 is formed at an uppermost level and a second level from above. However, embodiments of the inventive concept are not limited thereto. For example, in some embodiments, each of the first and third gate electrodes 402 and 406 may be formed at one or a plurality of levels. The second gate electrode 404 may be formed at a plurality of levels between the first and third gate electrodes 402 and 406.

Figure 15:
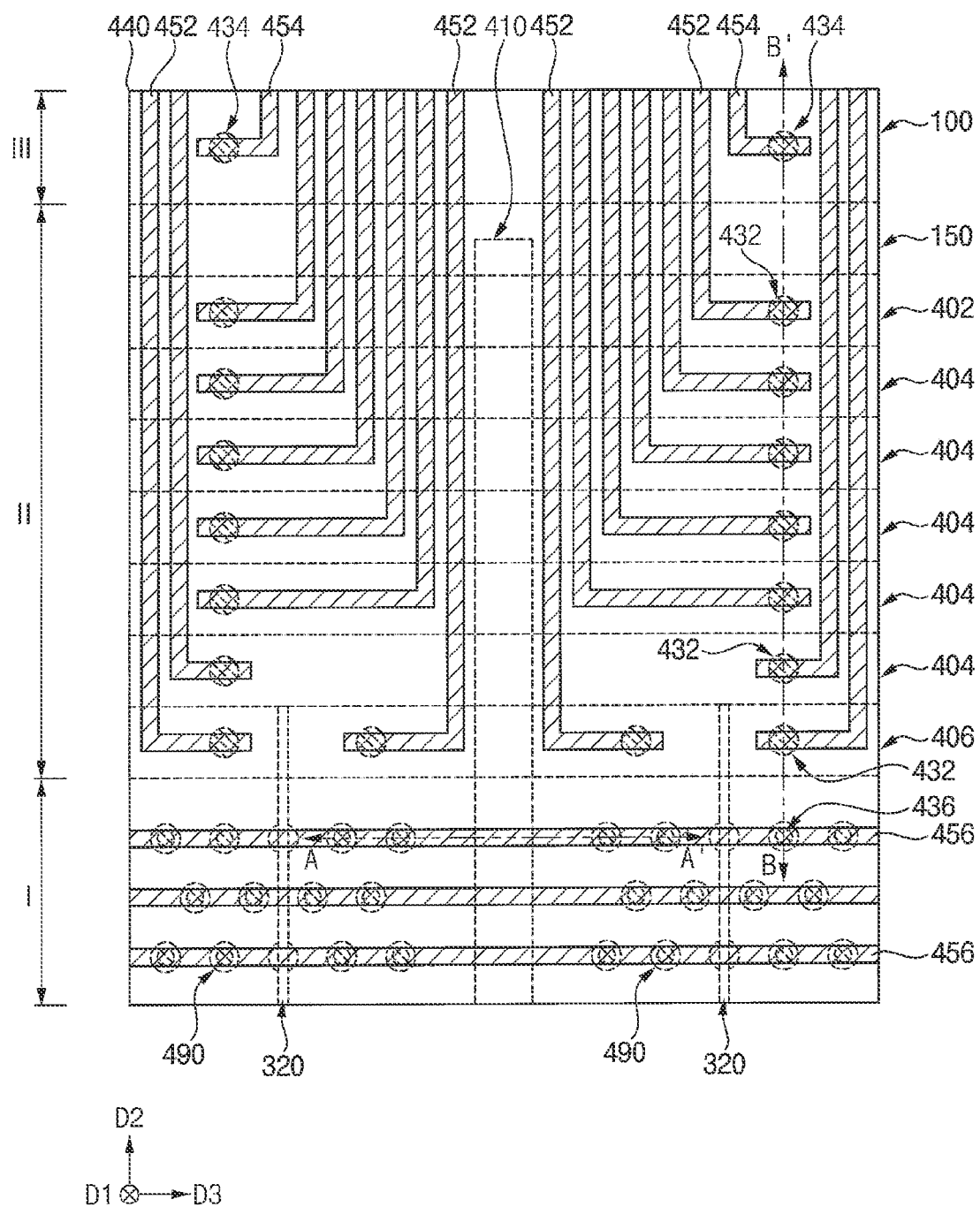
Figure 16:
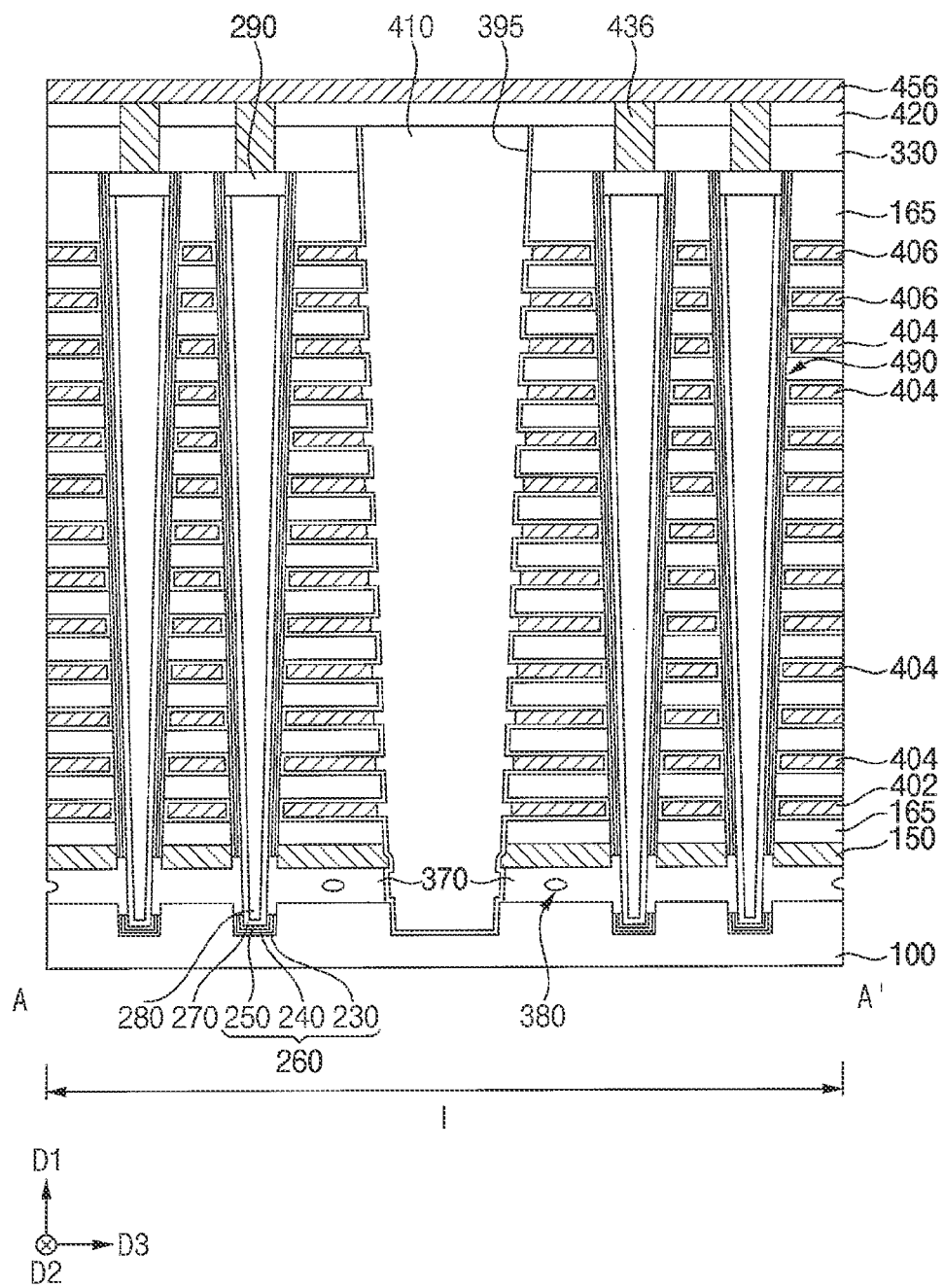
Figure 17:
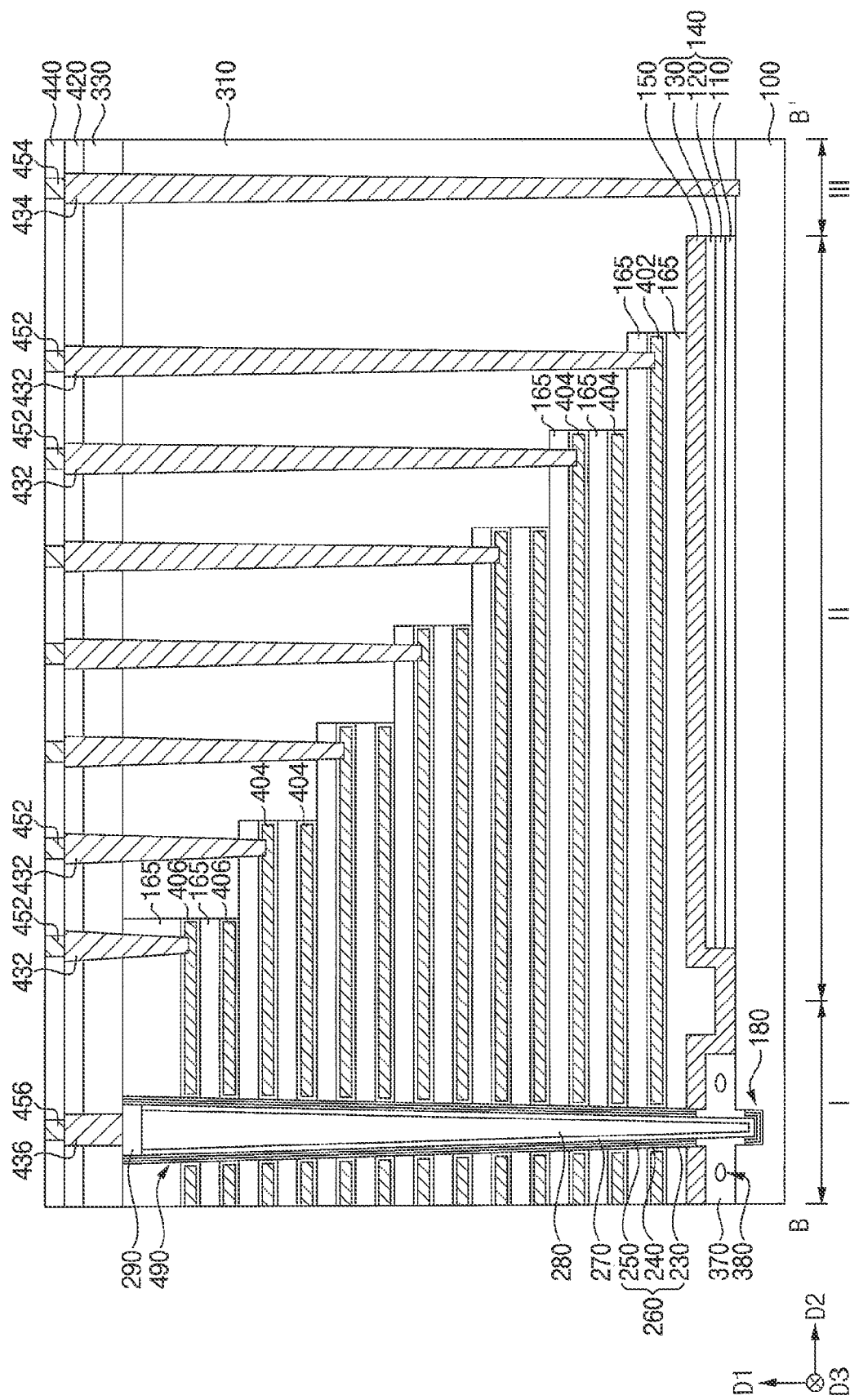

Referring to FIGS. 15 to 17, a division layer may be formed on the second blocking layer 390 to fill the second opening 340, and an upper portion of the division layer may be planarized until the upper surface of the second insulating interlayer 330 is exposed to form a second division pattern 410. During the planarization process, a portion of the second blocking layer 390 on the upper surface of the second insulating interlayer 330 may be removed, and a remaining portion of the second blocking layer 390 may remain as a second blocking pattern 395.

The second division pattern 410 may extend in the second direction D2, and a plurality of second division patterns 410 may be formed in the third direction D3. The second division pattern 410 may include an oxide, e.g., silicon oxide.

A third insulating interlayer 420 including an oxide, e.g., silicon oxide may be formed on the second insulating interlayer 330, the second division pattern 410 and the second blocking pattern 395. First contact plugs 432 extending through the first to third insulating interlayers 310, 330 and 420, the insulation pattern 165 and the second blocking pattern 395 to contact corresponding ones of the first to third gate electrodes 402, 404 and 406, respectively, may be formed. A second contact plug 434 extending through the first to third insulating interlayers 310, 330 and 420 to contact the upper surface of the first substrate 100 may be formed. Third contact plugs 436 extending through the second and third insulating interlayers 330 and 420 to contact corresponding ones of the capping patterns 290, respectively, may be formed. In example embodiments, each of the first to third contact plugs 432, 434 and 436 may have a width gradually decreasing from a bottom toward a top thereof.

A fourth insulating interlayer 440 including an oxide, e.g., silicon oxide may be formed on the third insulating interlayer 420, and first to third wirings 452, 454 and 456 extending through the fourth insulating interlayer 440 to contact the first to third contact plugs 432, 434 and 436, respectively, may be formed. The layouts of the first to third contact plugs 432, 434 and 436 and the first to third wirings 452, 454 and 456 are non-limiting, and various layouts thereof may be implemented.

The first to third contact plugs 432, 434 and 436 and the first to third wirings 452, 454 and 456 may include, e.g., a metal, a metal nitride, a metal silicide, doped polysilicon, etc.

In example embodiments, a plurality of second contact plugs 434 may be spaced apart from each other in each of the second and third directions D2 and D3 in the third region III of the first substrate 100. Each of the second contact plugs 434 may contact the first substrate 100 serving as a common source plate, and may transfer electrical signals applied from the second wiring 454 to the first substrate 100.

In example embodiments, the third wiring 456 may extend in the third direction D3 in the first region I of the first substrate 100, and a plurality of third wirings 456 may be spaced apart from each other in the second direction D2. Each of the third wirings 456 may serve as a bit line.

Figure 18:
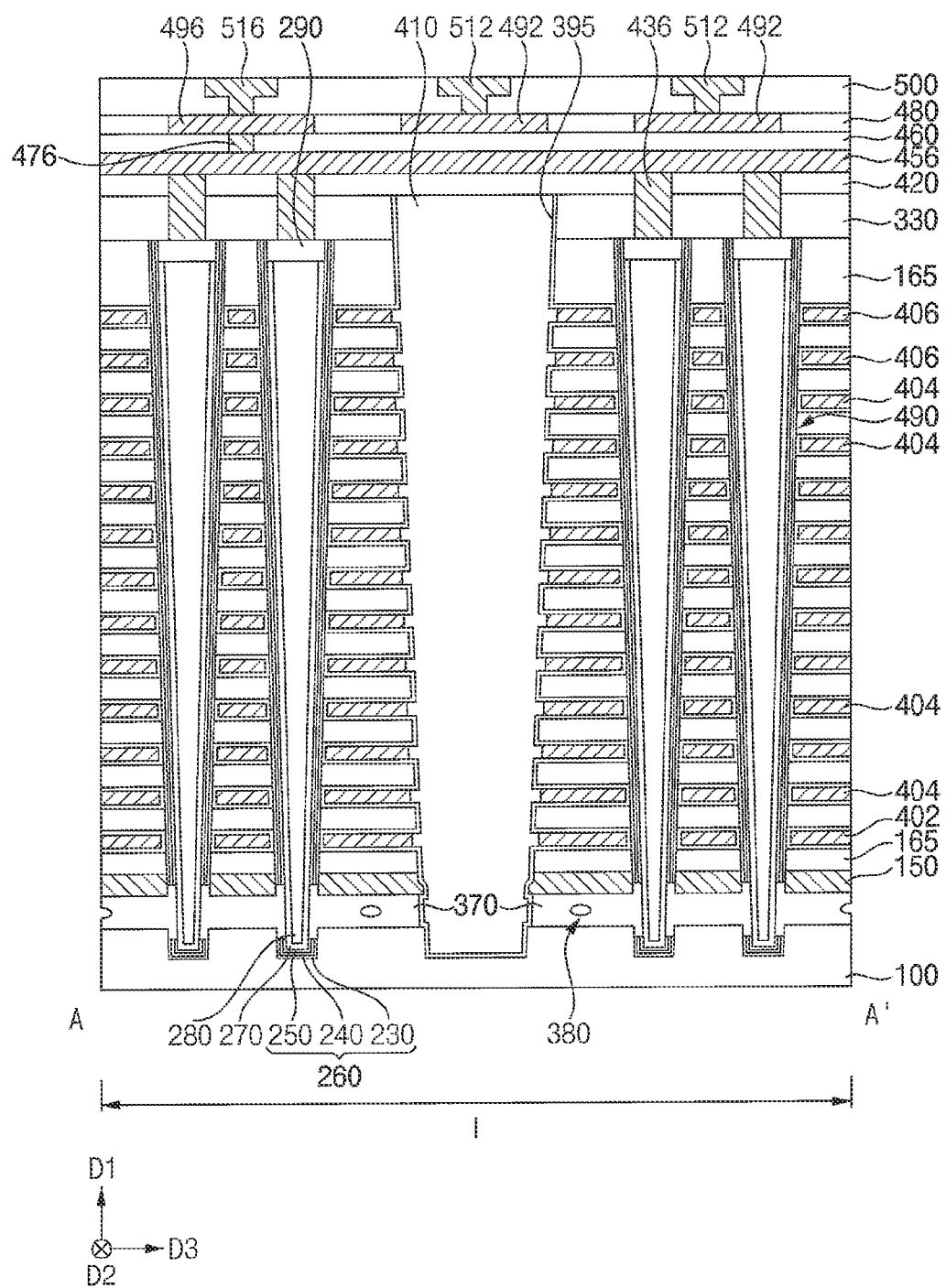
Figure 19:
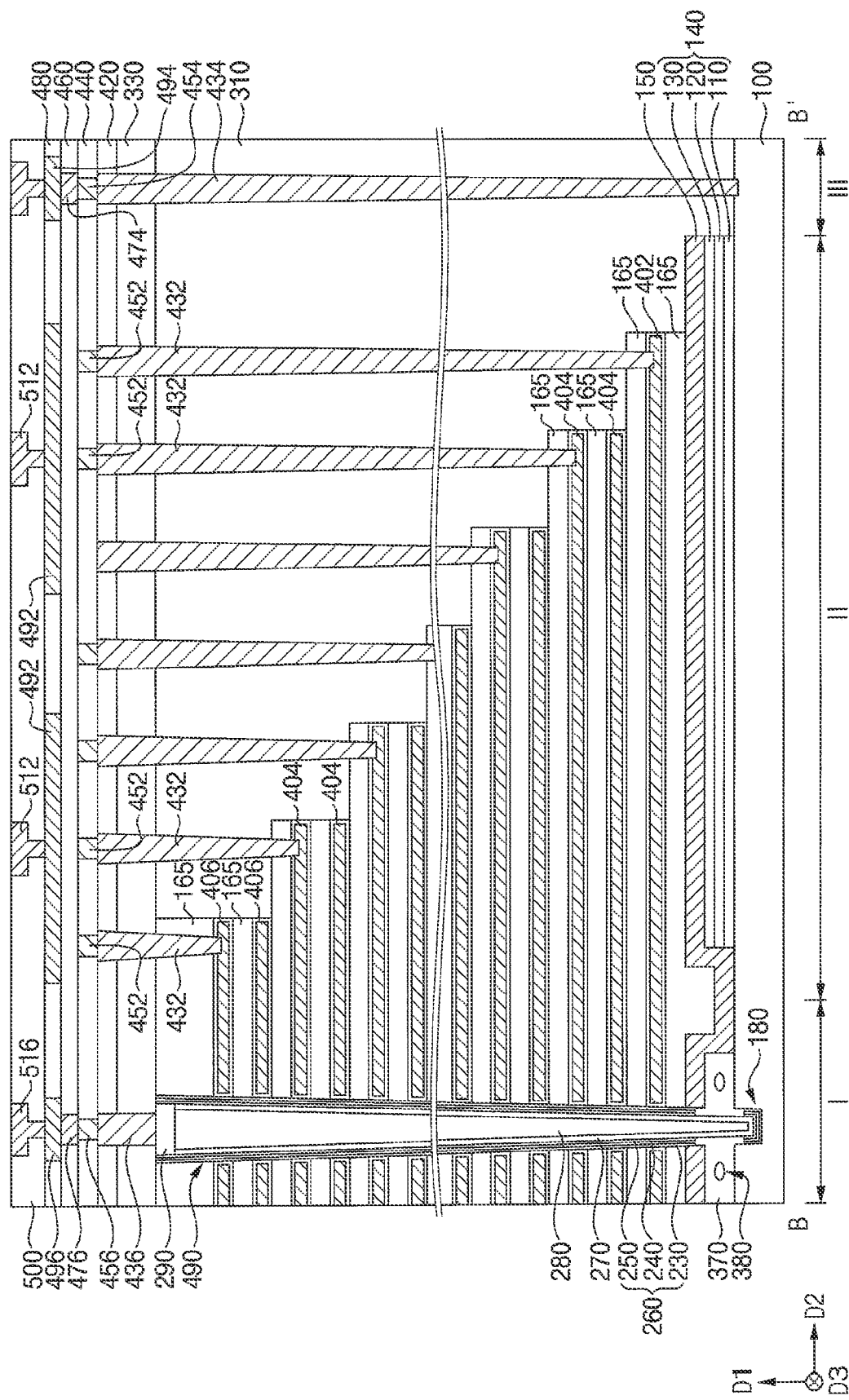

Referring to FIGS. 18 and 19, a fifth insulating interlayer 460 including an oxide, e.g., silicon oxide, may be formed on the fourth insulating interlayer 440 and the first to third contact plugs 432, 434 and 436, and a first via extending through the fourth insulating interlayer 440 to contact the first wiring 452 and second and third vias 474 and 476 extending through the fourth insulating interlayer 440 to contact the third and fourth wirings 454 and 456, respectively, may be formed.

A sixth insulating interlayer 480 may be formed on the fifth insulating interlayer 460, the first via, and the second and third vias, and a fourth wiring extending through the sixth insulating interlayer 480 to contact the first via, fifth and sixth wirings 494 and 496 extending through the sixth insulating interlayer 480 to contact the fifth and sixth wirings 494 and 496, respectively, and a first conductive pattern may be formed. The sixth insulating interlayer 480 may include an insulating material, e.g., an oxide such as silicon oxide or a nitride such as silicon nitride.

The first via, the second and third vias 474 and 476, the fourth wiring, the fifth and sixth wirings 494 and 496, and the first conductive pattern 492 may include a conductive material, e.g., a metal, a metal nitride, a metal silicide, and doped polysilicon.

In example embodiments, a plurality of first conductive patterns 492 may be spaced apart from each other in each of the second and third directions D2 and D3 in the first to third regions I, II and III of the first substrate 100, which may be arranged in various types of layouts. For example, a plurality of first conductive patterns 492, each of which may extend in the second direction D2, may be spaced apart from each other in the third direction D3. Alternatively, a plurality of first conductive patterns 492, each of which may extend in the third direction D3, may be spaced apart from each other in the second direction D2.

In example embodiments, the first conductive patterns 492 neighboring in a horizontal direction substantially parallel to the upper surface of the first substrate 100 and a portion of the sixth insulating interlayer 480 including an insulating material therebetween may form a capacitor.

Alternatively, in example embodiments, each of the first conductive patterns 492 may form a resistor that may have a resistance greater than those of the fourth wiring and the fifth and sixth wirings 494 and 496.

Alternatively, in example embodiments, each of the first conductive patterns 492 may form an inductor.

A seventh insulating interlayer 500 including an oxide, e.g., silicon oxide, may be formed on the sixth insulating interlayer 480, the fourth wiring, the fifth and sixth wirings 494 and 496, and the first conductive pattern 492. A first bonding pattern extending through the seventh insulating interlayer 500 to contact the fourth wiring may be formed. A second bonding pattern 512 extending through the seventh insulating interlayer 500 to contact the first conductive pattern 492 may be formed. Third and fourth bonding patterns 514 and 516 extending through the seventh insulating interlayer 500 to contact the fifth and sixth wirings 494 and 496, respectively, may be formed.

In example embodiments, the first bonding pattern and the second to fourth bonding patterns 512, 514 and 516 may be spaced apart from each other in each of the second and third directions D2 and D3 in the first to third regions I, II and III of the first substrate 100, and may be arranged, e.g., in a grid pattern in a plan view. In an example embodiment, each of the first bonding pattern and the second to fourth bonding patterns 512, 514 and 516 may be formed by a dual damascene process, and thus, may have a lower portion and an upper portion having a width greater than that of the lower portion. Alternatively, each of the first bonding pattern and the second to fourth bonding patterns 512, 514 and 516 may be formed by a single damascene process.

The first bonding pattern and the second to fourth bonding patterns 512, 514 and 516 may include a low resistance material, e.g., copper, aluminum, etc. The first bonding pattern and the second to fourth bonding patterns 512, 514 and 516 may correspond to the second bonding structure 4250 shown in FIG. 3.

Referring to FIG. 20, lower circuit patterns may be formed on a second substrate 700 including first to third active regions 702, 704 and 706 defined by an isolation pattern 710. The lower circuit patterns may include transistors, lower contact plugs, lower wirings, lower vias, etc.

FIG. 20 shows first to third transistors including first to third lower gate structures 752, 754 and 756 on the second substrate 700, and first to third impurity regions 701, 703 and 705 adjacent to upper portions of the first to third active regions 702, 704 and 706, respectively. However, embodiments of the inventive concept are not limited thereto. For example, in some embodiments, more than three transistors may be formed on the second substrate 700 to have various types of layouts.

The first lower gate structure 752 may include a first lower gate insulation pattern 722, a first lower gate electrode 732 and a first lower gate mask 742 sequentially stacked on the first active region 702. The second lower gate structure 754 may include a second lower gate insulation pattern 724, a second lower gate electrode 734 and a second lower gate mask 744 sequentially stacked on the second active region 704. The third lower gate structure 756 may include a third lower gate insulation pattern 726, a third lower gate electrode 736 and a third lower gate mask 746 sequentially stacked on the third active region 706.

Additionally, a first lower insulating interlayer 760 including an oxide, e.g., silicon oxide, may be formed on the second substrate 700 to cover the first to third transistors, and first to third lower contact plugs 772, 774 and 776 extending through the first lower insulating interlayer 760 to contact the first to third impurity regions 701, 703 and 705 may be formed.

A first lower wiring 782 may be formed on the first lower insulating interlayer 760 to contact an upper surface of the first lower contact plug 772, and a first lower via 792, a fourth lower wiring 802, a fourth lower via 812 and a seventh lower wiring 822 may be sequentially stacked on the first lower wiring 782. A second lower wiring 784 may be formed on the first lower insulating interlayer 760 to contact an upper surface of the second lower contact plug 774, and a second lower via 794, a fifth lower wiring 804, a fifth lower via 814 and an eighth lower wiring 824 may be sequentially stacked on the second lower wiring 784. A third lower wiring 786 may be formed on the first lower insulating interlayer 760 to contact an upper surface of the third lower contact plug 776, and a third lower via 796, a sixth lower wiring 806, a sixth lower via 816 and a ninth lower wiring 826 may be sequentially stacked on the third lower wiring 786.

The first to third lower wirings 782, 784, 786, 802, 804, 806, 822, 824 and 826 and the first to sixth lower vias 792, 794, 796, 812, 814 and 816 may be formed on the first lower insulating interlayer 760, and may be covered by a second lower insulating interlayer 830 including an oxide, e.g., silicon oxide.

The first to third lower contact plugs 772, 774 and 776, the first to sixth lower vias 792, 794, 796, 812, 814 and 816, and the first to third lower wirings 782, 784, 786, 802, 804, 806, 822, 824 and 826 may include a metal, e.g., tungsten, titanium, tantalum, etc., and may further include a metal nitride covering a lower surface and a sidewall thereof.

Referring to FIG. 21, a third lower insulating interlayer 840 including an oxide, e.g., silicon oxide, may be formed on the second insulating interlayer 830 and the seventh to ninth lower wirings 822, 824 and 826, and sixth to eighth bonding patterns 852, 854 and 856 extending through the third lower insulating interlayer 840 to contact the seventh to ninth lower wirings 822, 824 and 826, respectively, may be formed.

In example embodiments, the sixth to eighth bonding patterns 852, 854 and 856 may be formed at positions corresponding to those of the second to fourth bonding patterns 512, 514 and 516, respectively, on the first substrate 100. A fifth bonding pattern may be further formed on the second substrate 700, which may correspond to the first bonding pattern on the first substrate 100, and a fourth transistor applying electrical signals to the fifth bonding pattern, and lower contact plugs, lower wirings, lower vias, etc., electrically connected thereto, may be further formed.

The fifth bonding pattern and the sixth to eighth bonding patterns 852, 854 and 856 may be formed by a dual damascene process or a single damascene process, and may include a low resistance material, e.g., copper, aluminum, etc. The fifth bonding pattern and the sixth to eighth bonding patterns 852, 854 and 856 may correspond to the first bonding structure 4150 shown in FIG. 3.

Figure 22:
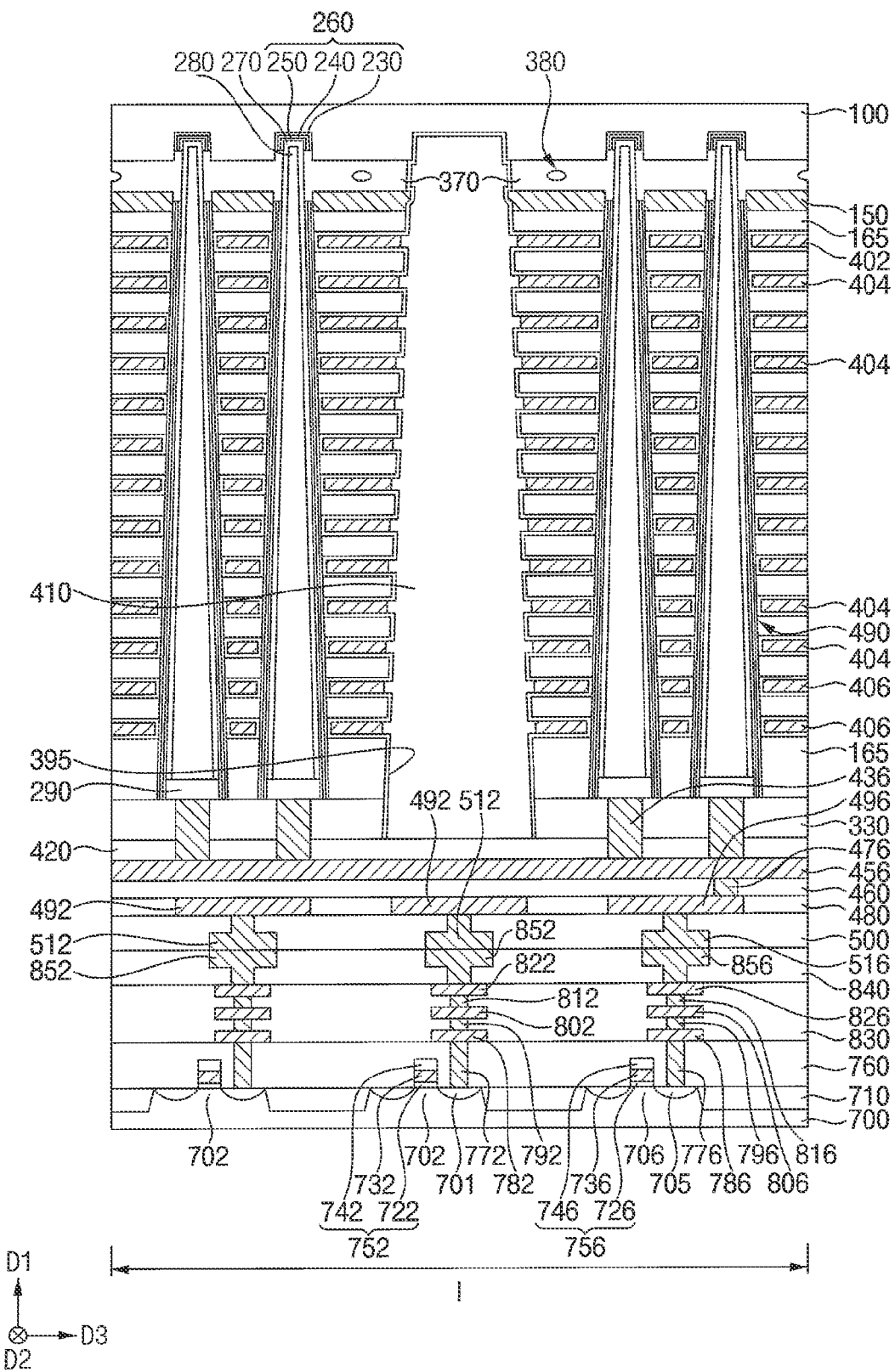
Figure 23:
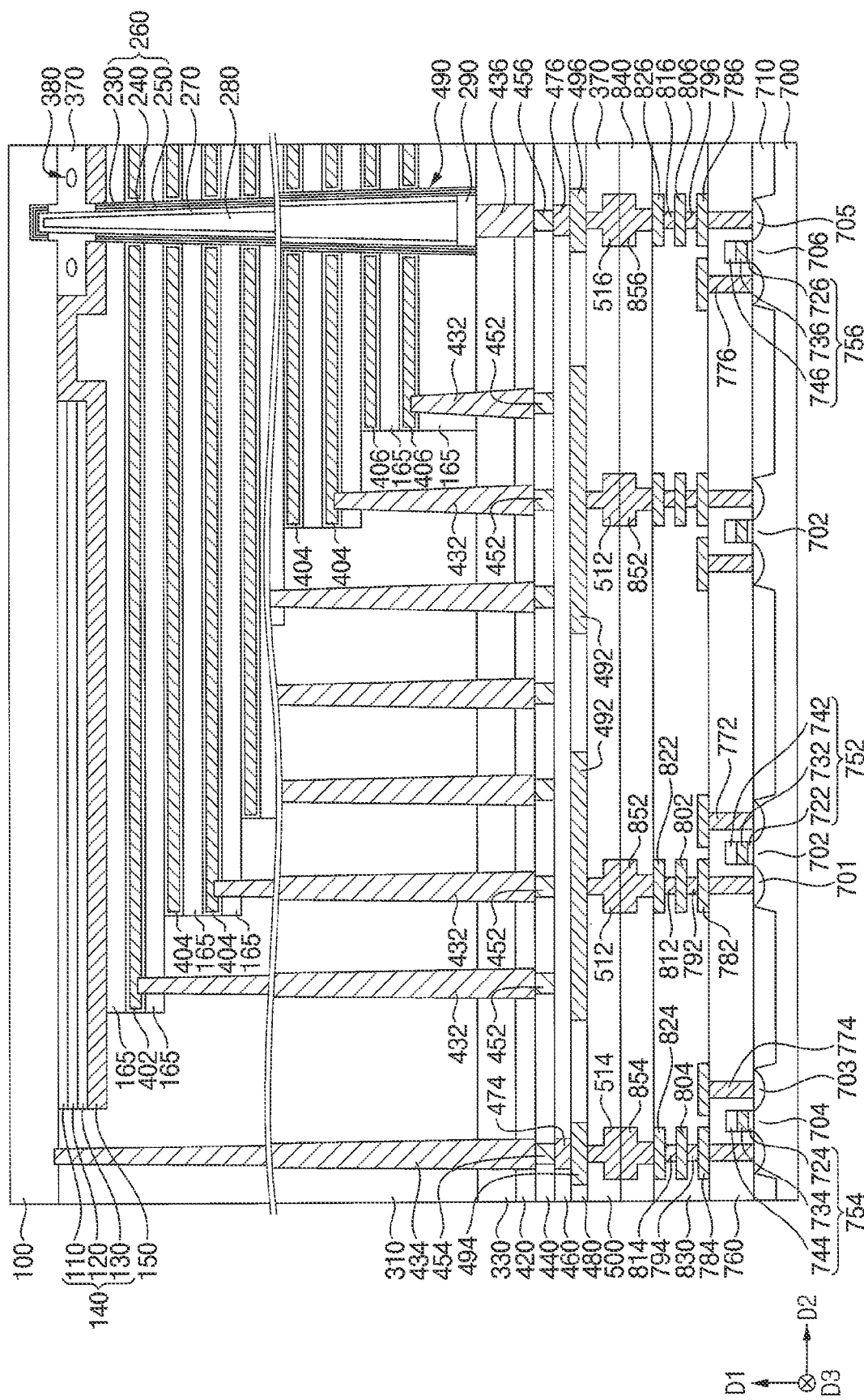

Referring to FIGS. 22 and 23, the first substrate 100 may be overturned, and the seventh insulating interlayer 500 may be bonded with the third lower insulating interlayer 840 on the second substrate 700. The first bonding pattern and the second to fourth bonding patterns 512, 514 and 516 may contact the fifth bonding pattern and the sixth to eighth bonding patterns 852, 854 and 856, respectively.

Thus, the structures on the first substrate 100 may be upside down, and hereinafter, the upward and downward directions of the structures on the first substrate 100 will be described with reference to the inverted directions.

For example, the first and second substrates 100 and 700 may be referred to as upper and lower substrates 100 and 700, respectively. The gate electrodes included in the gate electrode structure may be stacked in a staircase shape in which extension lengths in the second direction D2 increase in a stepwise manner from a bottom toward a top thereof. Each of the memory channel structure 490 and the first to third contact plugs 432, 434 and 436 may have a width gradually increasing from a top toward a bottom thereof.

The first to third regions I, II and III of the first substrate 100 may be applied to corresponding portions of the second substrate 700 that may overlap the first to third regions I, II and III of the first substrate 100 in the first direction D1.

The semiconductor device may be manufactured by the above processes.

The semiconductor device may have the following structural characteristics.

The semiconductor device may include the lower circuit patterns on the second substrate 700. The semiconductor device may further include the fifth bonding pattern and the sixth to eighth bonding patterns 852, 854 and 856 including a conductive material on and electrically connected to some of the lower circuit patterns. The semiconductor device may further include the first bonding pattern and the second to fourth bonding patterns 512, 514 and 516 including a conductive material on and contacting the fifth bonding pattern and the sixth to eighth bonding patterns 852, 854 and 856, respectively. The semiconductor device may further include the first conductive patterns 492 including a conductive material on and contacting some of the first bonding pattern and the second and fourth bonding patterns 512, 514 and 516, respectively. The semiconductor device may further include the sixth wiring 496 spaced apart from the first conductive patterns 492 at the same height as that of the first conductive patterns 492 and contacting the fourth bonding pattern 516. The semiconductor device may further include the fifth wiring 494 spaced apart from the first conductive patterns 492 and the sixth wiring 496 at the same height as that of the first conductive patterns 492 and contacting the third bonding pattern 514. The semiconductor device may further include the bit line 456 on and electrically connected to the sixth wiring 496. The semiconductor device may further include the gate electrode structure including the gate electrodes 402, 404 and 406 spaced apart from each other in the first direction D1 on the bit line 456 and sequentially stacked in a staircase shape in which extension lengths in the second direction D2 increase in a stepwise manner from a lowermost level toward an uppermost level. The semiconductor device may further include the memory channel structure 490 including the filling pattern 280 extending through at least a portion of the gate electrode structure in the first direction D1, the channel 270 on a sidewall of the filling pattern 280, the charge storage structure 260 on an outer sidewall of the channel 270, and the capping pattern 290 on lower surfaces of the channel 270 and the filling pattern 280 and contacting an inner sidewall of the charge storage structure 260. The semiconductor device may further include the first substrate 100 on the memory channel structure 490. The semiconductor device may further include the second contact plug 434 extending in the first direction D1 from a lower surface of the first substrate 100 and electrically connected to the fifth wiring 494. The gate electrodes 402, 404 and 406, the channels 270 extending through the gate electrodes 402, 404 and 406, and the charge storage structures 260 between the channels 270 and the gate electrodes 402, 404 and 406 may form memory cells.

In example embodiments, the bit line 456 may extend in the third direction D3, and a plurality of bit lines 456 may be spaced apart from each other in the second direction D2.

Each of the bit lines 456 may be electrically connected to the third transistor through the third via 476 and the sixth wiring 496, and may be electrically connected to the memory channel structures 490 arranged in the third direction D3 through the third contact plugs 436. In an example embodiment, the third transistor may be a transistor included in the page buffer 1120 shown in FIG. 1.

In example embodiments, the second contact plug 434 may be electrically connected to the fifth wiring 494 through the second wiring 454 and the second via 474, and thus, may be electrically connected to the second transistor. In an example embodiment, the second transistor may be a transistor included in the decoder circuit 1110 shown in FIG. 1. In example embodiments, the first substrate 100 may be doped with, e.g., n-type impurities, and the first substrate 100 may serve as a CSL plate. The second contact plug 434 may contact the first substrate 100, and may transfer electrical signals applied from the second transistor to the first substrate 100. Thus, the second contact plug 434 may be referred to as a CSL contact plug.

In example embodiments, a plurality of second contact plugs 434 may be spaced apart from each other in each of the second and third directions D2 and D3. In example embodiments, the second contact plug 434 may have a ring shape in the third region III of the second substrate 700 in a plan view (refer to FIG. 26).

The semiconductor device may further include the first contact plugs 432 extending in the first direction D1 to contact the gate electrodes 402, 404 and 406, respectively, included in the gate electrode structure, and the first wirings 452 contacting the first contact plugs 432, respectively. Electrical signals may be applied to each of the first wirings 452 through the first via, the fourth wiring, and the first and fifth bonding patterns. In an example embodiment, the fourth transistor may be a transistor included in the decoder circuit 1110 shown in FIG. 1.

As illustrated above, the second to fourth transistors under a bonding structure having upper bonding patterns including the first bonding pattern and the second to fourth bonding patterns 512, 514 and 516, and lower bonding patterns including the fifth bonding pattern and the sixth to eighth bonding patterns 852, 854 and 856, may receive electrical signals through a portion of the bonding structure and the fifth and sixth wirings 494 and 496 and the fourth wiring on the portion of the bonding structure, and thus, electrical signals may be applied to the CSL plate 100, the bit line 456 and each of the gate electrodes 402, 404 and 406.

In example embodiments, each of the lower bonding patterns may include a lower portion and an upper portion, and a width of the upper portion may be greater than that of the lower portion. Each of the lower and upper bonding patterns may include, for example, copper or aluminum.

The first conductive patterns 492 at the same level as the fourth wiring and the fifth and sixth wirings 494 and 496 may be electrically connected to the first transistors, respectively, through the second and sixth bonding patterns 512 and 852. In example embodiments, the first conductive patterns 492 and a portion of the sixth insulating interlayer 480 between the first conductive patterns 492 may serve as a capacitor. Alternatively, the first conductive patterns 492 may serve as a resistor. Alternatively, the first conductive patterns 492 may serve as an inductor.

That is, the first conductive patterns 492 may serve as passive devices, e.g., capacitors, resistors, inductors, etc. In the drawings, the first conductive patterns 492 are electrically connected to the first impurity region 701 included in the first transistor. However, embodiments of the inventive concept are not limited thereto. The first conductive patterns 492 may be electrically connected to the first lower gate structure 752 included in the first transistor or the first lower contact plug 772, or may be electrically connected to a ground region in the second substrate 700.

As described above, the first conductive patterns 492 may be formed at the same level as the fourth wiring and the fifth and sixth wirings 494 and 496 on the bonding structure, instead of being directly formed on the second substrate 700. Thus, an increase of area due to the formation of the passive device serving as, e.g., a capacitor on the second substrate 700, may be reduced so as to increase the integration degree of the semiconductor device.

Figure 24:
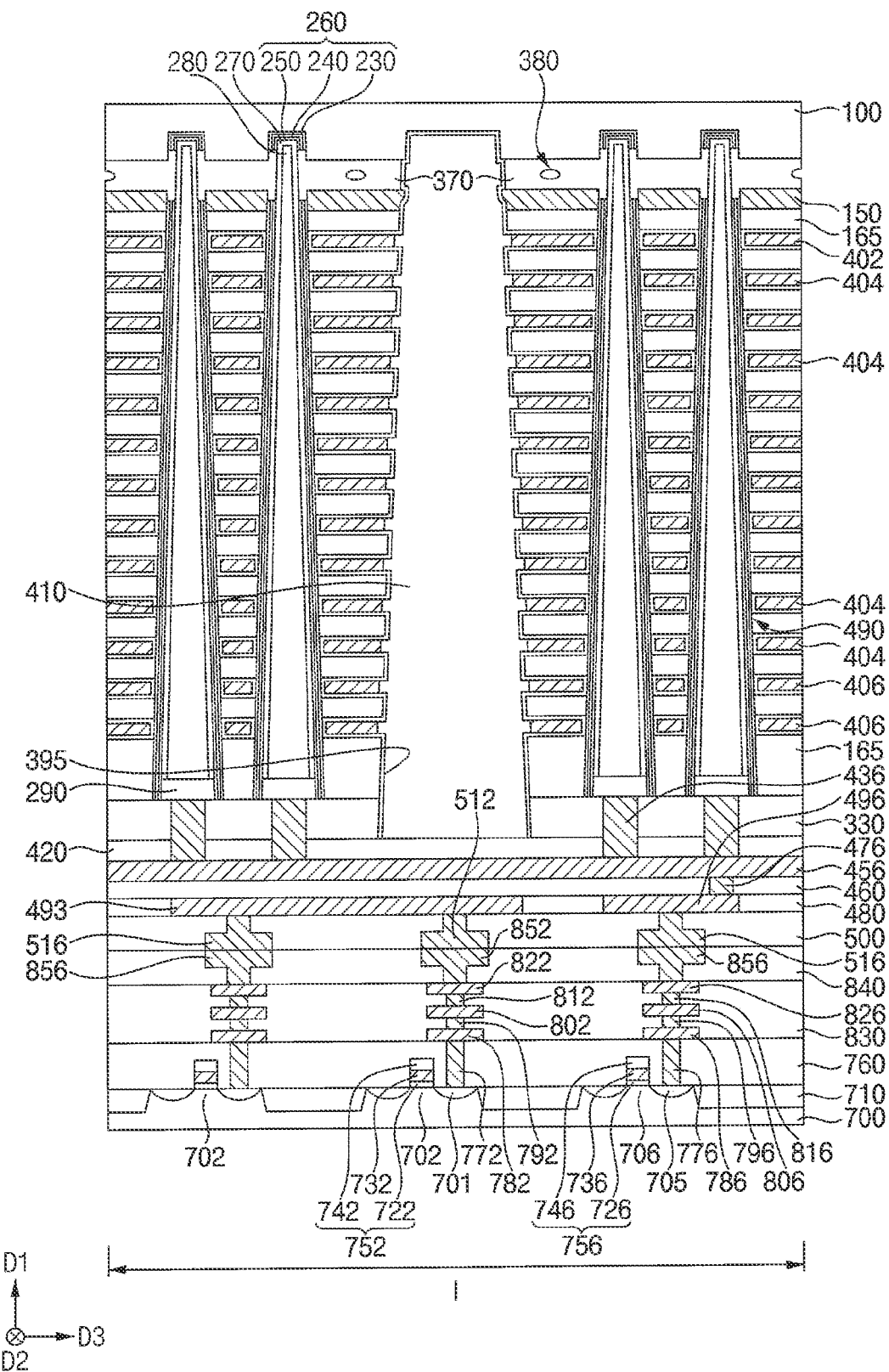
FIGS. 24 and 25 are cross-sectional views illustrating a semiconductor device in accordance with example embodiments, which may correspond to the cross-sectional views of FIGS. 22 and 23, respectively.
Figure 25:
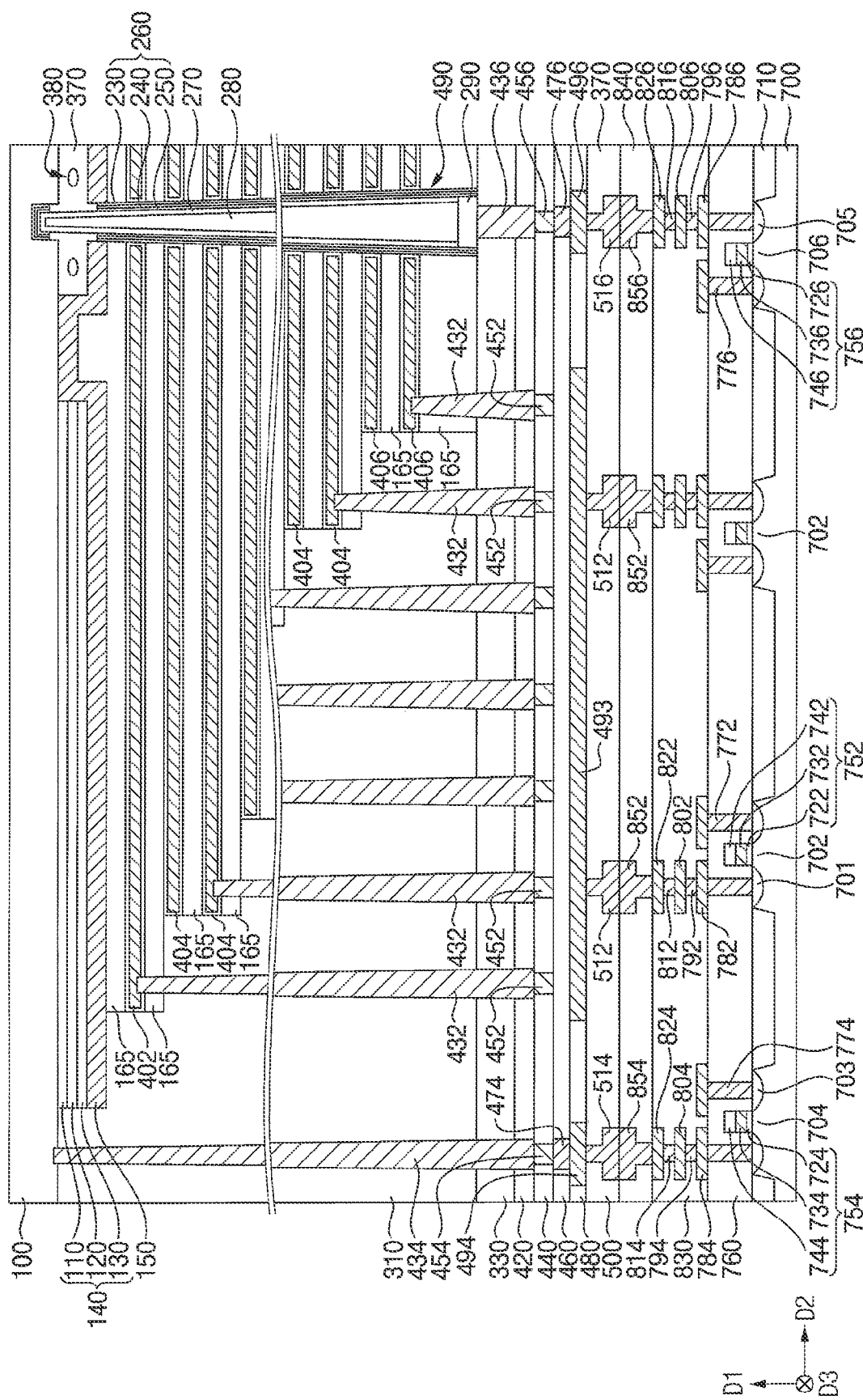

FIGS. 24 and 25 are cross-sectional views illustrating a semiconductor device in accordance with example embodiments, which may correspond to the cross-sectional views of FIGS. 22 and 23, respectively. The semiconductor device of FIGS. 24 and 25 may be substantially the same as or similar to that of FIGS. 22 and 23, except for first and second conductive patterns. For convenience of explanation, a further description of components and technical aspects previously described may be omitted.

In an example embodiment, the semiconductor device may include a second conductive pattern 493 instead of the first conductive patterns 492, and the second conductive pattern 493 may be electrically connected to each of the first transistors through the second bonding patterns 512 and the sixth bonding patterns 852. Unlike the first conductive patterns 492 serving as the passive devices in FIGS. 22 and 23, the second conductive pattern 493 may serve as a wiring for transferring electrical signals between the first transistors. Like the first conductive patterns 492, the second conductive pattern 493 may be electrically connected to the first lower gate structure 752 or the first lower contact plug 772, or may be electrically connected to a ground region in the second substrate 700, in addition to being electrically connected to the first impurity region 701 included in the first transistor.

Accordingly, the lower circuit patterns on the second substrate 700 may be electrically connected to each other through the bonding structure and the second conductive pattern 493 on the bonding structure, which may increase the integration degree along the vertical direction or the horizontal direction, when compared to forming wirings at an additional level on the lower circuit patterns or at the same level as other wirings.

According to example embodiments, The semiconductor device may include the second conductive pattern 493 in place of the first conductive patterns 492, or may include the second conductive pattern 493 in addition to the first conductive patterns 492.

Figure 26:
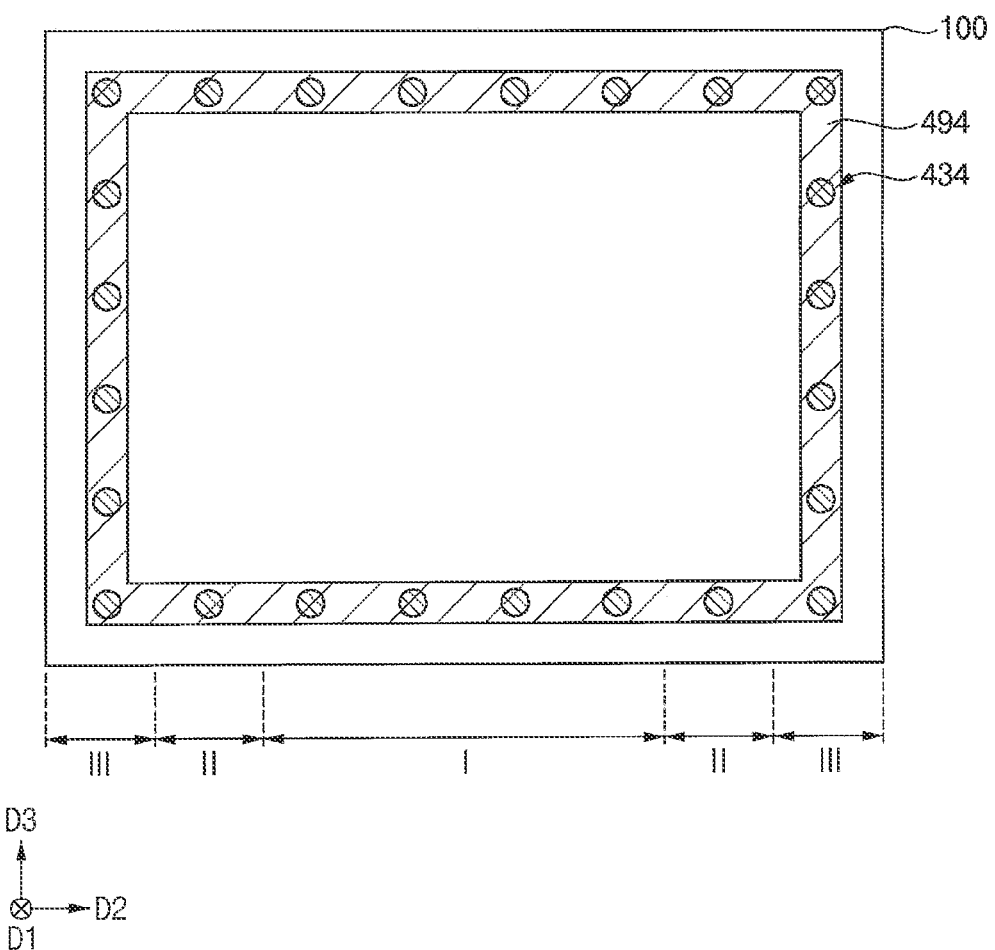
FIG. 26 is a plan view illustrating a layout of a fifth wiring included in the semiconductor device in accordance with example embodiments.

FIG. 26 is a plan view illustrating a layout of a fifth wiring included in the semiconductor device in accordance with example embodiments.

As illustrated above, a plurality of second contact plugs 434 may be spaced apart from each other in each of the second and third directions D2 and D3 in the third region III of the first substrate 100, and the fifth wiring 494 may have, e.g., a ring shape in a plan view, so as to be electrically connected to the second contact plugs 434 through the second via 474 and the second wiring 454.

That is, among the first conductive patterns 492, the fourth wiring, and the fifth and sixth wirings 494 and 496 at the same level on the bonding structure, the fourth wiring and the sixth wiring 496 may apply electrical signals to conductive structures over and under, respectively, the bonding structure therethrough, the first conductive patterns 492 may apply electrical signals to conductive structures under the bonding structure therethrough, and the fifth wiring 494 may apply electrical signals to conductive structures over the bonding structure therethrough. In some embodiments, the fifth wiring 494 may also apply electrical signals to conductive structures under the bonding structure therethrough.

Figure 27:
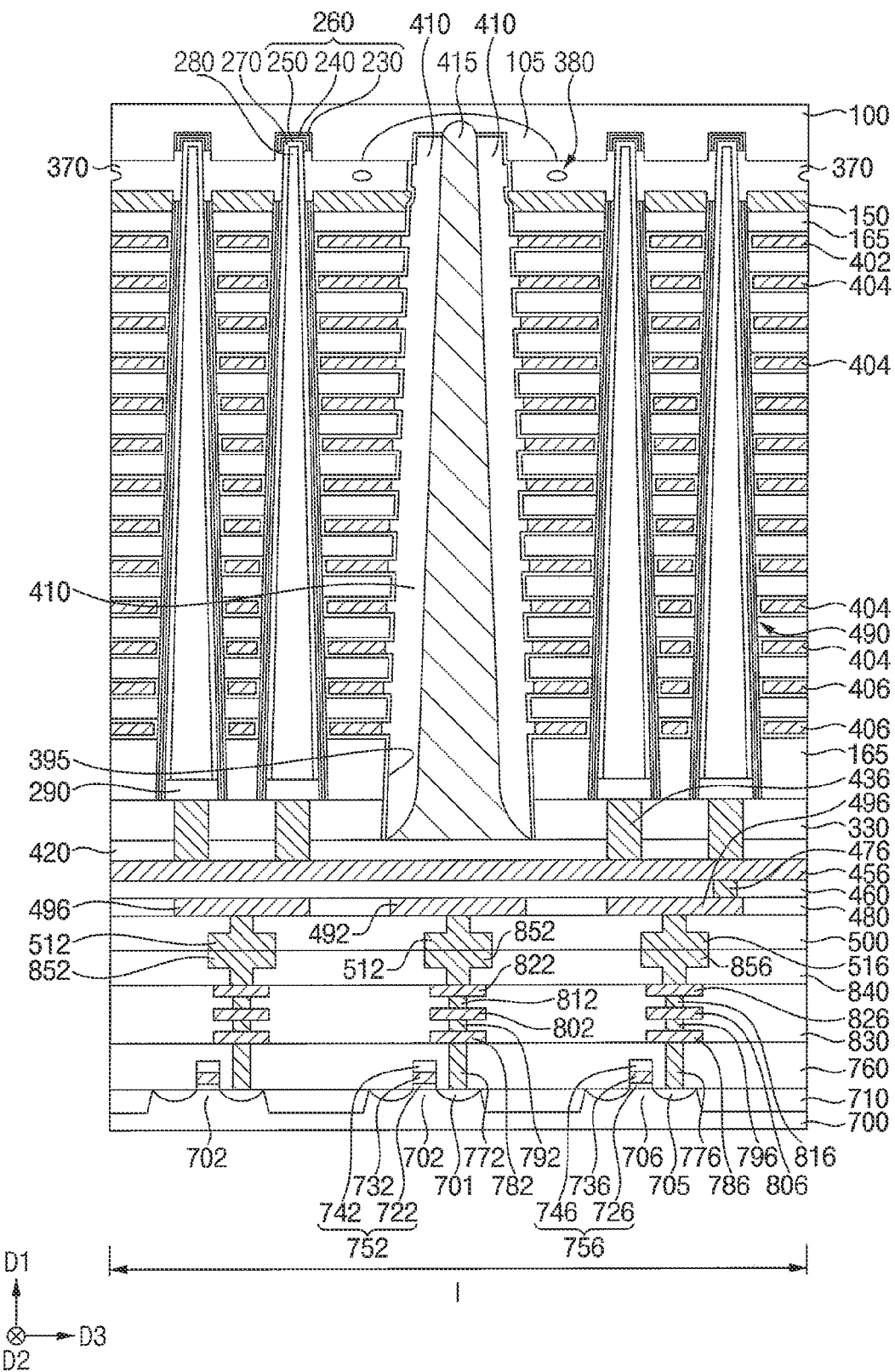
FIG. 27 is a cross-sectional view illustrating a semiconductor device in accordance with example embodiments, which may correspond to the cross-sectional view of FIG. 22.

FIG. 27 is a cross-sectional view illustrating a semiconductor device in accordance with example embodiments, which may correspond to the cross-sectional view of FIG. 22. The semiconductor device of FIG. 27 may be substantially the same as or similar to that of FIGS. 22 and 23, except for the second division pattern, a fourth contact plug and a fourth impurity region. For convenience of explanation, a further description of components and technical aspects previously described may be omitted.

The semiconductor device may further include a fourth contact plug 415 in each of the second openings 340 in addition to the second division pattern 410. In an example embodiment, the fourth contact plug 415 may extend in the second direction D2, and may serve as a CSL together with a fourth impurity region 105 at a lower portion of the first substrate 100. The second division pattern 410 may be formed at each of opposite sidewalls in the third direction D3 of the fourth contact plug 415.

Alternatively, in some embodiments, the fourth impurity region 105 may extend in the second direction D2 at a lower portion of the first substrate 100 to serve as a CSL, while the fourth contact plug 415 does not extend in the second direction D2, and a plurality of fourth contact plugs 415 may be spaced apart from each other in the second direction D2. In this case, a sidewall of the fourth contact plug 415 may be covered by the second division pattern 410.

In some embodiments in which the fourth impurity region 105 and/or the fourth contact plug 415 serves as the CSL, the second contact plug 434 is not formed. The second via 474 and the second wiring 454 may be formed on each of the fourth contact plugs 415, and the fifth wirings 494 may extend, e.g., in the third direction D3, so that the fourth contact plugs 415 arranged in the third direction D3 may be electrically connected with each other.

Figure 28:
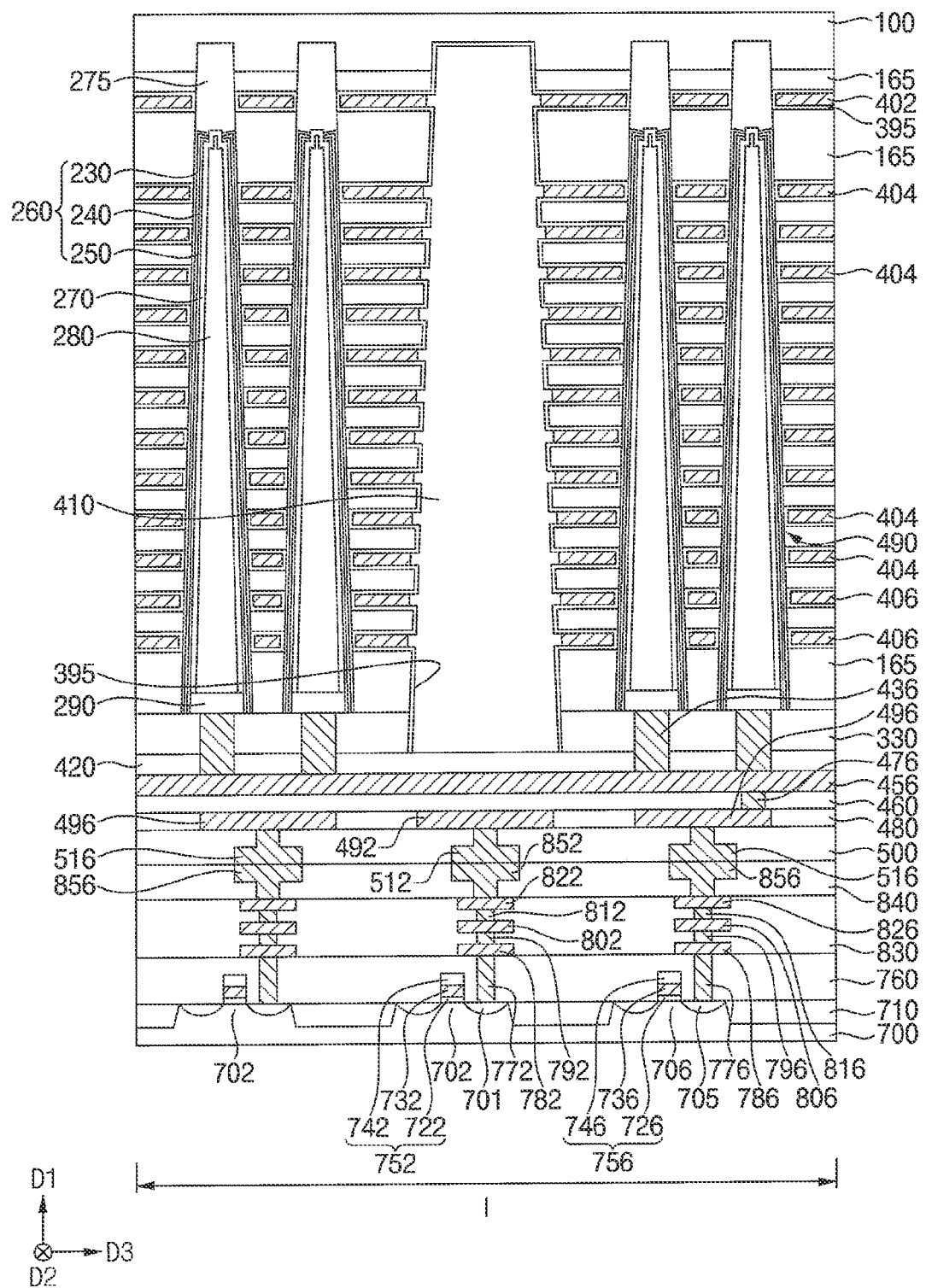
FIG. 28 is a cross-sectional view illustrating a semiconductor device in accordance with example embodiments, which may correspond to the cross-sectional view of FIG. 22.

FIG. 28 is a cross-sectional view illustrating a semiconductor device in accordance with example embodiments, which may correspond to the cross-sectional view of FIG. 22. The semiconductor device of FIG. 28 may be substantially the same as or similar to that of FIGS. 22 and 23, except for the memory channel structure. For convenience of explanation, a further description of components and technical aspects previously described may be omitted.

The memory channel structure 490 may further include a semiconductor pattern 275 under and contacting a lower surface of the first substrate 100, and the charge storage structure 260, the channel 270, the filling pattern 280 and the capping pattern 290 may be formed under the semiconductor pattern 275.

The semiconductor pattern 275 may include, e.g., single crystalline silicon or polysilicon. In an example embodiment, a lower surface of the semiconductor pattern 275 may be formed at a height between lower and upper surfaces of the insulation pattern 165 between the first and second gate electrodes 402 and 404. The charge storage structure 260 may have an inverted cup-like shape of which a central upper surface is opened, and may contact an edge lower surface of the semiconductor pattern 275. The channel 270 may have an inverted cup-like shape, and may contact a central lower surface of the semiconductor pattern 275. Thus, the channel 270 may be electrically connected to the first substrate 100 through the semiconductor pattern 275.

In an example embodiment, the channel connection pattern 370 and the support layer 150 are not formed between the first substrate 100 and the first gate electrode 402. In an example embodiment, one of the insulation patterns 165 between the first and second gate electrodes 402 and 404 may have a thickness greater than those of other ones of the insulation pattern 165 at lower levels.

Figure 29:
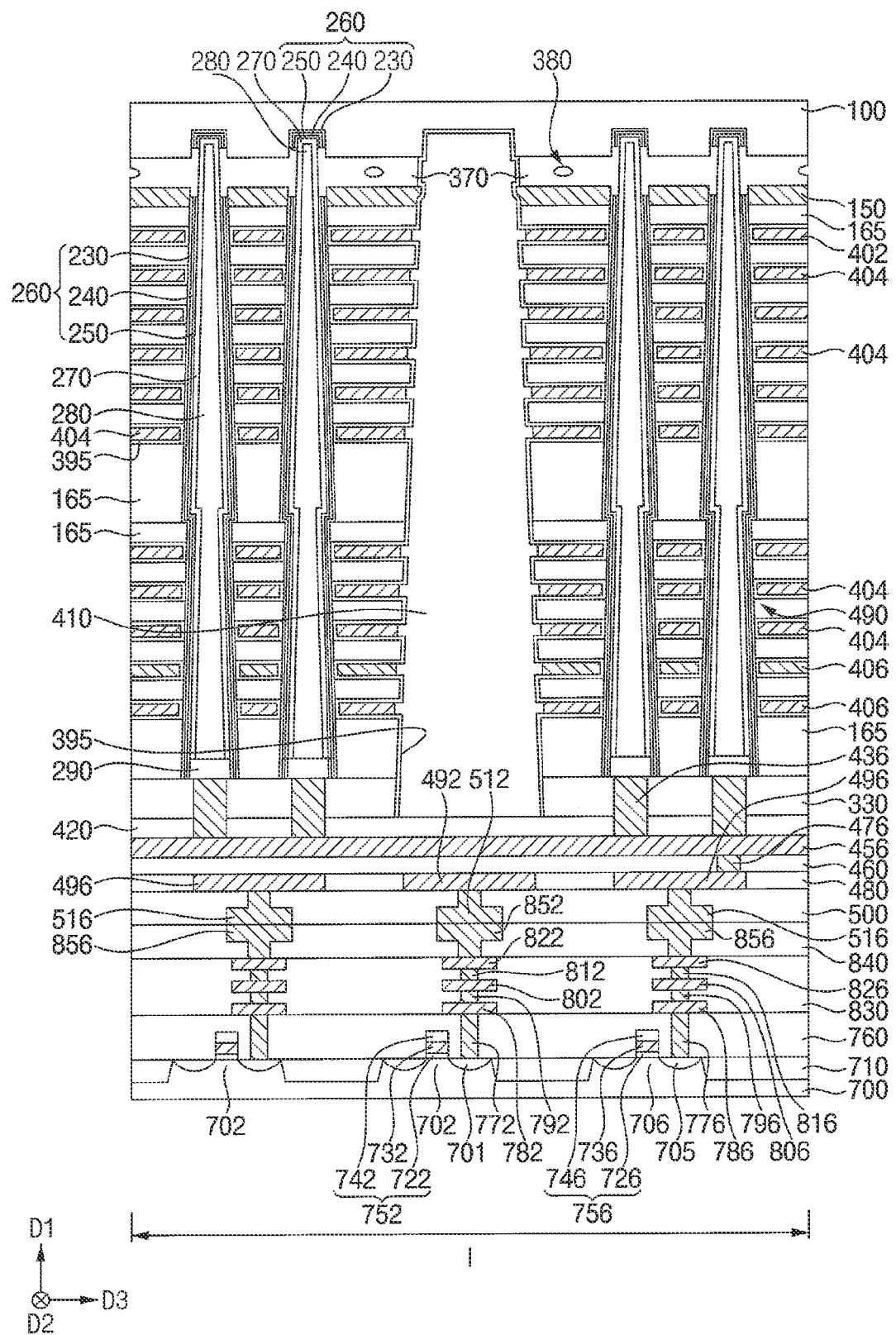
FIG. 29 is a cross-sectional view illustrating a semiconductor device in accordance with example embodiments, which may correspond to the cross-sectional view of FIG. 22.

FIG. 29 is a cross-sectional view illustrating a semiconductor device in accordance with example embodiments, which may correspond to the cross-sectional view of FIG. 22. The semiconductor device of FIG. 29 may be substantially the same as or similar to that of FIGS. 22 and 23, except for the memory channel structure. For convenience of explanation, a further description of components and technical aspects previously described may be omitted.

The memory channel structure 490 may include lower and upper portions sequentially stacked, and each of the lower and upper portions may have a width gradually decreasing from a bottom toward a top thereof. In example embodiments, a lower surface of the upper portion of the memory channel structure 490 may have an area greater than that of an upper surface of the lower portion thereof.

In FIG. 29, the memory channel structure 490 includes two portions, that is, the lower and upper portions. However, embodiments of the inventive concept are not limited thereto, and according to some embodiments, more than two portions may be included. Each of the portions of the memory channel structure 490 may have a width gradually decreasing from a bottom toward a top thereof, and an area of a lower surface of an upper portion may be greater than that of an upper surface of a lower portion that is directly under the upper portion.

Figure 30:
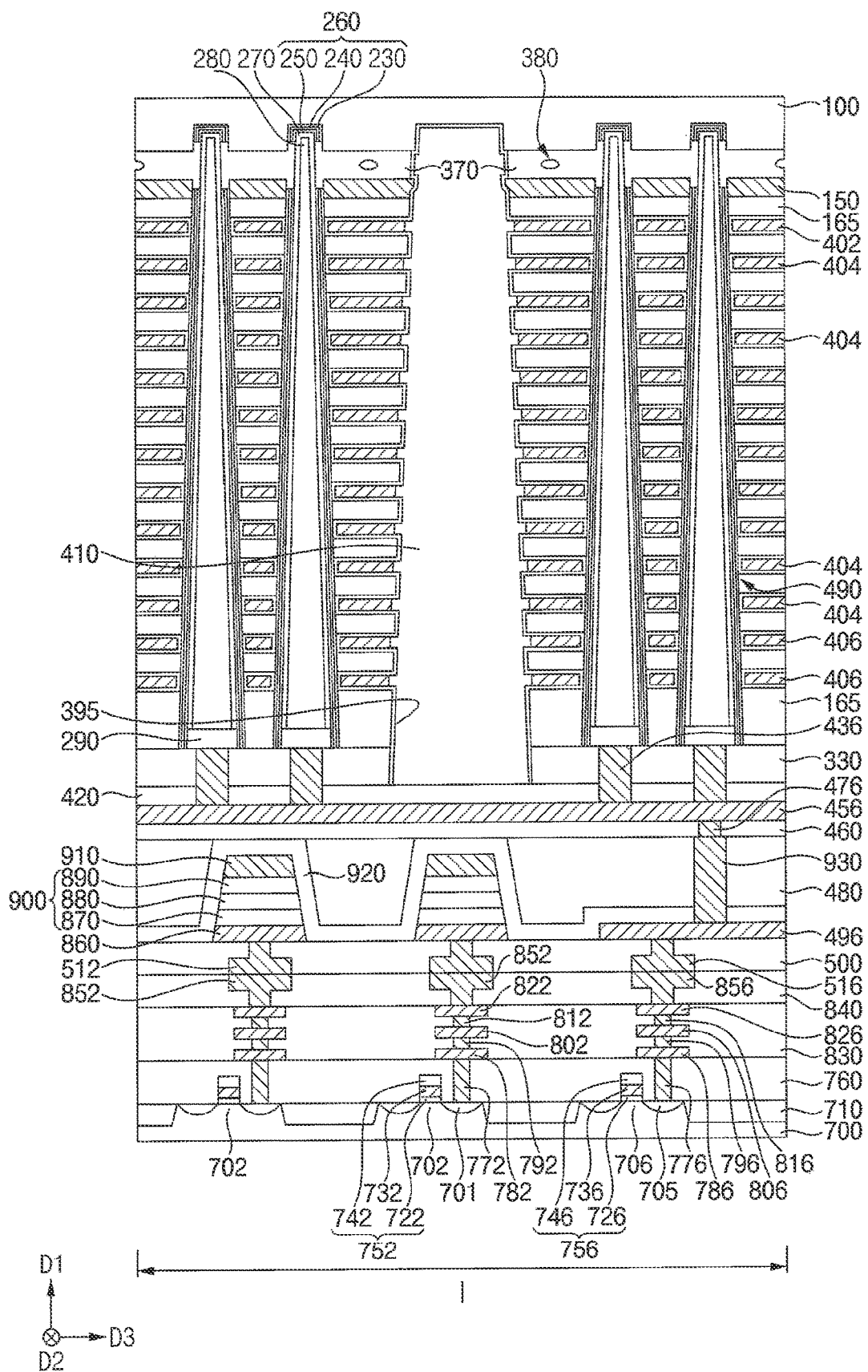
FIG. 30 is a cross-sectional view illustrating a semiconductor device in accordance with example embodiments, which may correspond to the cross-sectional view of FIG. 22.

FIG. 30 is a cross-sectional view illustrating a semiconductor device in accordance with example embodiments, which may correspond to the cross-sectional view of FIG. 22. The semiconductor device of FIG. 30 may be substantially the same as or similar to that of FIGS. 22 and 23, except that the semiconductor device includes an active device, e.g., a memory unit of an MRAM device in the sixth insulating interlayer, instead of the passive device such as the first conductive pattern 492. For convenience of explanation, a further description of components and technical aspects previously described may be omitted.

Referring to FIG. 30, the semiconductor device may include a first lower electrode 860, a magnetic tunnel junction (MTJ) structure 900, and a first upper electrode 910 sequentially stacked in the sixth insulating interlayer 480, which may form a memory unit of a magnetic random access memory (MRAM) device.

The MTJ structure 900 may include a pinned structure 870, a tunnel barrier pattern 880, and a free layer pattern 890 sequentially stacked. In an example embodiment, the pinned structure 870 may include a pinned pattern, a lower ferromagnetic pattern, an anti-ferromagnetic coupling spacer, and an upper ferromagnetic pattern sequentially stacked.

The pinned pattern may include, e.g., ferro manganese (FeMn), iridium manganese (IrMn), platinum manganese (PtMn), manganese oxide (MnO), manganese sulfide (MnS), manganese telluride (MnTe), manganese fluoride ($MnF_2$), iron fluoride ($FeF_2$), iron chloride ($FeCl_2$), iron oxide (FeO), cobalt chloride ($CoCl_2$), cobalt oxide (CoO), nickel chloride ($NiCl_2$), nickel oxide (NiO), chrome, etc. Each of the upper and lower ferromagnetic patterns may include ferromagnetic material containing at least one of, e.g., iron (Fe), nickel (Ni) or cobalt (Co). The anti-ferromagnetic coupling spacer may include a noble metal, e.g., ruthenium (Ru), iridium (Ir), palladium (Pd), osmium (Os), or rhodium (Rh).

The tunnel barrier pattern 880 may include, e.g., aluminum oxide or magnesium oxide, and the free layer pattern 890 may include a ferromagnetic material containing at least one of, e.g., iron (Fe), nickel (Ni) or cobalt (Co).

Alternatively, the locations of the pinned structure 870 and the free layer pattern 890 in the MTJ structure 900 may be changed, or at least one of the pinned structure 870, the tunnel barrier pattern 880 or the free layer pattern 890 may be formed in a plurality.

The first lower electrode 860 and the first upper electrode 910 may include a conductive material, e.g., a metal, a metal nitride, a metal silicide, or doped polysilicon.

A lower surface of the memory unit may contact an upper surface of the second bonding pattern 512, and may be electrically connected to the third wiring 456 serving as a bit line, the second gate electrodes 404 serving as word lines, or other conductive patterns for applying electrical signals through vias and wirings.

A protection pattern 920 may be further formed to cover a sidewall and an upper surface of the memory unit, and a seventh via 930 may be formed in the sixth insulating interlayer 480 to connect the third and sixth wirings 456 and 496 with each other.

Figure 31:
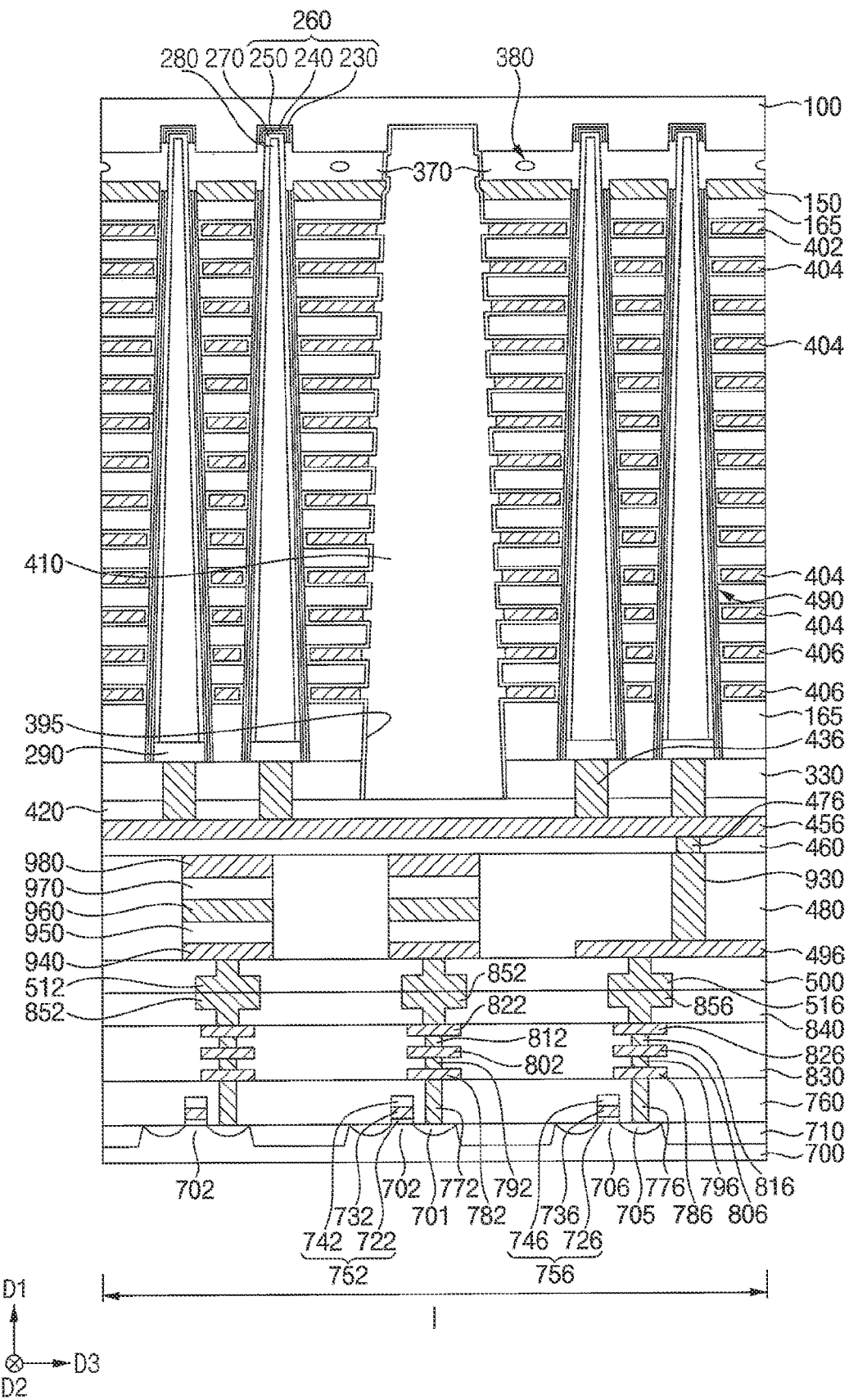
FIG. 31 is a cross-sectional view illustrating a semiconductor device in accordance with example embodiments, which may correspond to the cross-sectional view of FIG. 22.

FIG. 31 is a cross-sectional view illustrating a semiconductor device in accordance with example embodiments, which may correspond to the cross-sectional view of FIG. 22. The semiconductor device of FIG. 31 may be substantially the same as or similar to that of FIGS. 22 and 23, except that the semiconductor device includes an active device, e.g., a memory unit of a PRAM device in the sixth insulating interlayer, instead of the passive device such as the first conductive pattern 492. For convenience of explanation, a further description of components and technical aspects previously described may be omitted.

Referring to FIG. 31, the semiconductor device may include a second lower electrode 940, a selection pattern 950, a middle electrode 960, a variable resistance pattern 970, and a second upper electrode 980 sequentially stacked in the sixth insulating interlayer 480, which may form a memory unit of a phase-changeable random access memory (PRAM) device.

The second lower electrode 940, the middle electrode 960 and the second upper electrode 980 may include, e.g., a metal, a metal nitride, a metal silicide, or doped polysilicon.

The selection pattern 950 may include an ovonic threshold switching (OTS) material, which may serve as a switching element due to a resistance difference depending on an applied voltage while maintaining an amorphous state.

In example embodiments, the OTS material may include a binary material, e.g., GeSe, GeS, AsSe, AsTe, AsS SiTe, SiSe, SiS, GeAs, SiAs, SnSe, SnTe, etc., a ternary material, e.g., GeAsTe, GeAsSe, AlAsTe, AlAsSe, SiAsSe, SiAsTe, GeSeTe, GeSeSb, GaAsSe, GaAsTe, InAsSe, InAsTe, SnAsSe, SnAsTe, etc., a quaternary material, e.g., GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, GeAsTeZn, a quintary material, e.g., GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, GeAsSeZnSn, etc., or a senary material, e.g., GeSiAsSeTeS, GeSiAsSeTeIn, GeSiAsSeTeGa, GeSiAsSeTeAl, GeSiAsSeTeTl, GeSiAsSeTeZn, GeSiAsSeTeSn, GeSiAsSeTeP, GeSiAsSeSIn, GeSiAsSeSGa, GeSiAsSeSAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSeTePIn, GeAsSeTePGa, GeAsSeTePAl, GeAsSeTePTl, GeAsSeTePZn, GeAsSeTePSn, GeSiAsSeInGa, GeSiAsSeInAl, GeSiAsSeInTl, GeSiAsSeInZn, GeSiAsSeInSn, GeSiAsSeGaAl, GeSiAsSeGaTl, GeSiAsSeGaZn, GeSiAsSeGaSn, GeSiAsSeAlSn, GeAsSeTeInGa, GeAsSeTeInAl, GeAsSeTeInTl, GeAsSeTeInZn, GeAsSeTeInSn, GeAsSeTeGaAl, GeAsSeTeGaTl, GeAsSeTeGaZn, GeAsSeTeGaSn, GeAsSeTeAlSn, GeAsSeSInGa, GeAsSeSInAl, GeAsSeSInTl, GeAsSeSInZn, GeAsSeSInSn, GeAsSeSGaAl, GeAsSeSGaTl, GeAsSeSGaZn, GeAsSeSGaSn, GeAsSeSAlSn, etc.

In example embodiments, the OTS material may further include at least one of boron (B), carbon (C), nitrogen (N), or oxygen (O) in addition to the above-mentioned materials. In example embodiments, the selection pattern 950 may include a single layer, or a multi-layer.

The variable resistance pattern 970 may include a material of which a resistance may change according to the phase-change thereof. In example embodiments, the variable resistance pattern 970 may include a chalcogenide-based material in which germanium (Ge), antimony (Sb) and/or tellurium (Te) are combined at a given ratio.

In example embodiments, the variable resistance pattern 970 may include a binary material, e.g., GeTe, GeSe, GeS, SbSe, SbTe, SbS, SbSe, SnSb, InSe, InSb, AsTe, AlTe, GaSb, AlSb, BiSb, ScSb, Ysb, CeSb, DySb, NdSb, etc., a ternary material, e.g., GeSbSe, AlSbTe, AlSbSe, SiSbSe, SiSbTe, GeSeTe, InGeTe, GeSbTe, GeAsTe, SnSeTe, GeGaSe, BiSbSe, GaSeTe, InGeSb, GaSbSe, GaSbTe, InSbSe, InSbTe, SnSbSe, SnSbTe, ScSbTe, ScSbSe, ScSbS, YSbTe, YSbSe, YSbS, CeSbTe, CeSbSe, CeSbS, DySbTe, DySbSe, DySbS, NdSbTe, NdSbSe, NdSbS, etc., a quaternary material, e.g., GeSbTeS, BiSbTeSe, AgInSbTe, GeSbSeTe, GeSnSbTe, SiGeSbTe, SiGeSbSe, SiGeSeTe, BiGeSeTe, BiSiGeSe, BiSiGeTe, GeSbTeBi, GeSbSeBi, GeSbSeIn, GeSbSeGa, GeSbSeAl, GeSbSeTl, GeSbSeSn, GeSbSeZn, GeSbTeIn, GeSbTeGa, GeSbTeAl, GeSbTeTl, GeSbTeSn, GeSbTeZn, ScGeSbTe, ScGeSbSe, ScGeSbS, YGeSbTe, YGeSbSe, YGeSbS, CeGeSbTe, CeGeSbSe, CeGeSbS, DyGeSbTe, DyGeSbSe, DyGeSbS, NdGeSbTe, NdGeSbSe, NdGeSbS, or a quintary material, e.g., InSbTeAsSe, GeScSbSeTe, GeSbSeTeS, GeScSbSeS, GeScSbTeS, GeScSeTeS, GeScSbSeP, GeScSbTeP, GeSbSeTeP, GeScSbSeIn, GeScSbSeGa, GeScSbSeAl, GeScSbSeTl, GeScSbSeZn, GeScSbSeSn, GeScSbTeIn, GeScSbTeGa, GeSbAsTeAl, GeScSbTeTl, GeScSbTeZn, GeScSbTeSn, GeSbSeTeIn, GeSbSeTeGa, GeSbSeTeAl, GeSbSeTeTl, GeSbSeTeZn, GeSbSeTeSn, GeSbSeSIn, GeSbSeSGa, GeSbSeSAl, GeSbSeSTl, GeSbSeSZn, GeSbSeSSn, GeSbTeSIn, GeSbTeSGa, GeSbTeSAl, GeSbTeSTl, GeSbTeSZn, GeSbTeSSn, GeSbSeInGa, GeSbSeInAl, GeSbSeInTl, GeSbSeInZn, GeSbSeInSn, GeSbSeGaAl, GeSbSeGaTl, GeSbSeGaZn, GeSbSeGaSn, GeSbSeAlTl, GeSbSeAlZn, GeSbSeAlSn, GeSbSeTlZn, GeSbSeTlSn, GeSbSeZnSn, etc.

In example embodiments, the variable resistance pattern 970 may further include at least one of boron (B), carbon (C), nitrogen (N), oxygen (O), phosphorus (P), cadmium (Cd), tungsten (W), titanium (Ti), hafnium (Hf), or zirconium (Zr), in addition to the above-mentioned materials. In example embodiments, the variable resistance pattern 970 may include a single layer, or a multi-layer.

In an example embodiment, the variable resistance pattern 970 may include a super lattice in which a germanium-tellurium (GeTe) and an antimony-tellurium (SbTe) are repeatedly stacked. In an example embodiment, the variable resistance pattern 970 may include IST containing indium-antimony-tellurium, or BST containing bismuth-antimony-tellurium.

A lower surface of the memory unit may contact an upper surface of the second bonding pattern 512, and may be electrically connected to the third wiring 456 serving as a bit line, the second gate electrodes 404 serving as word lines, or other conductive patterns for applying electrical signals through vias and wirings.

The seventh via 930 may be formed in the sixth insulating interlayer 480 to connect the third and sixth wirings 456 and 496 with each other.

As illustrated above, active devices such as memory units of an MRAM device or a PRAM device may be formed on the bonding structure, instead of the passive devices such as capacitors, resistors, inductors, etc. Additionally, active devices such as memory units of an FRAM device or an RRAM device may also be formed on the bonding structure. In some embodiments, both of the active devices and the passive devices may be formed on the bonding structure.

In an example embodiment of the inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. In an example embodiment of the inventive concept, the 3D memory array includes vertical NAND strings that are vertically oriented such that at least one memory cell is located over another memory cell. The at least one memory cell may include a charge trap layer. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

While the inventive concept has been particularly shown and described with reference to the example embodiments thereof, it will be understood by those of ordinary skill in the art that various changes in form and detail may be made therein without departing from the spirit and scope of the inventive concept as defined by the following claims.

What is claimed is:

1. A semiconductor device, comprising:
    a plurality of lower circuit patterns disposed on a lower substrate;
    a plurality of lower bonding patterns disposed on the lower circuit patterns, the lower bonding patterns including a first conductive material and being electrically connected to the lower circuit patterns, respectively;
    a plurality of upper bonding patterns disposed on and contacting the lower bonding patterns, respectively, the upper bonding patterns including a second conductive material;
    a passive device disposed on the upper bonding patterns, the passive device including a third conductive material and contacting one of the upper bonding patterns;
    a gate electrode structure disposed on the passive device, the gate electrode structure including gate electrodes spaced apart from each other in a first direction perpendicular to an upper surface of the lower substrate, each of the gate electrodes extending in a second direction parallel to the upper surface of the lower substrate,
    wherein extension lengths of the gate electrodes increase from a lowermost level toward an uppermost level in a stepwise manner in the second direction;
    a channel extending through at least a portion of the gate electrode structure;
    an upper substrate disposed on the channel,
    a first wiring disposed at a same level as the passive device, the first wiring being spaced apart from the passive device; and
    a bit line extending between the first wiring and the channel in a third direction parallel to the upper surface of the lower substrate and crossing the second direction, the bit line being electrically connected to the channel and the first wiring,
    wherein the passive device is electrically connected to neither the gate electrode structure nor the bit line.

2. The semiconductor device of claim 1, wherein the passive device comprises:
    an insulating interlayer; and
    a plurality of conductive patterns extending through the insulating interlayer,
    wherein each of the conductive patterns contacts one of the upper bonding patterns, and
    wherein neighboring two of the conductive patterns and a portion of the insulating interlayer therebetween form a capacitor.

3. The semiconductor device of claim 1, wherein the passive device includes a resistor.

4. The semiconductor device of claim 1, wherein the passive device includes an inductor.

5. The semiconductor device of claim 1, wherein the first wiring contacts one of the upper bonding patterns, and is electrically connected to one of the lower circuit patterns.

6. The semiconductor device of claim 1, further comprising:
    a second wiring disposed at the same level as the first wiring and the passive device, the second wiring being spaced apart from the passive device and the first wiring; and
    a contact plug extending in the first direction and contacting the upper substrate, the contact plug being electrically connected to the second wiring.

7. The semiconductor device of claim 6, wherein the second wiring contacts one of the upper bonding patterns and is electrically connected to one of the lower circuit patterns.

8. The semiconductor device of claim 6, wherein the contact plug is one of a plurality of contact plugs spaced apart from each other in each of the second and third directions, and wherein the second wiring is commonly electrically connected to the plurality of contact plugs.

9. The semiconductor device of claim 8, wherein the plurality of contact plugs is arranged in a ring shape in a plan view, and
wherein the second wiring has a ring shape in the plan view.

10. The semiconductor device of claim 1, further comprising:
a wiring disposed at a same level as the passive device, the wiring being spaced apart from the passive device and contacting the upper bonding patterns,
wherein the lower circuit patterns are electrically connected with each other through the wiring, the upper bonding patterns, and the lower bonding patterns contacting the upper bonding patterns, respectively.

11. The semiconductor device of claim 1, wherein each of the lower bonding patterns includes lower and upper portions, a width of the upper portion being greater than a width of the lower portion.

12. A semiconductor device, comprising:
a plurality of lower circuit patterns disposed on a lower substrate, adjacent ones of the lower circuit patterns being spaced apart from each other by one of a plurality of isolation patterns;
a plurality of lower bonding patterns disposed on the lower circuit patterns, the lower bonding patterns including a first conductive material and being electrically connected to the lower circuit patterns, respectively;
a plurality of upper bonding patterns disposed on and contacting the lower bonding patterns, respectively, the upper bonding patterns including a second conductive material;
a first wiring disposed on the upper bonding patterns, the first wiring contacting ones of the upper bonding patterns;
a gate electrode structure disposed on the first wiring, the gate electrode structure including gate electrodes spaced apart from each other in a first direction perpendicular to an upper surface of the lower substrate, each of the gate electrodes extending in a second direction parallel to the upper surface of the lower substrate,
wherein extension lengths of the gate electrodes increase from a lowermost level toward an uppermost level in a stepwise manner in the second direction;
a channel extending through at least a portion of the gate electrode structure; and
an upper substrate disposed on the channel,
wherein ones of the lower circuit patterns are electrically connected with each other through the first wiring, the ones of the upper bonding patterns, and the lower bonding patterns contacting the ones of the upper bonding patterns, respectively.

13. The semiconductor device of claim 12, wherein the lower circuit patterns include transistors, and
wherein the transistors are electrically connected with each other through the first wiring, the upper bonding patterns, and the lower bonding patterns contacting the upper bonding patterns, respectively.

14. The semiconductor device of claim 12, further comprising:
a second wiring disposed at a same level as the first wiring, the second wiring being spaced apart from the first wiring; and
a bit line extending between the second wiring and the channel in a third direction parallel to the upper surface of the lower substrate and crossing the second direction, the bit line being electrically connected to the channel and the second wiring.

15. The semiconductor device of claim 12, further comprising:
a passive device disposed at a same height as the first wiring, the passive device being spaced apart from the first wiring,
wherein the passive device contacts one of the upper bonding patterns and is electrically connected to one of the lower circuit patterns through the one of the upper bonding patterns.

16. A semiconductor device, comprising:
an upper substrate;
a plurality of memory cells disposed under the upper substrate;
a channel extending through at least a portion of the memory cells;
a passive device disposed under the memory cells;
a plurality of upper bonding patterns disposed under the passive device;
a plurality of lower bonding patterns disposed under and contacting the upper bonding patterns, respectively;
a plurality of transistors disposed under and electrically connected to the lower bonding patterns, respectively;
a lower substrate disposed under the transistors,
a first wiring disposed at a same level as the passive device, the first wiring being spaced apart from the passive device; and
a bit line extending between the first wiring and the channel, the bit line being electrically connected to the channel and the first wiring,
wherein the passive device is electrically connected to neither the memory cells nor the bit line,
wherein the passive device contacts one of the upper bonding patterns and is electrically connected to one of the transistors through the one of the upper bonding patterns.

17. The semiconductor device of claim 16, wherein the memory cells comprise:
a plurality of gate electrodes spaced apart from each other in a first direction perpendicular to a lower surface of the upper substrate, each of the gate electrodes extending in a second direction parallel to the lower surface of the upper substrate;
a plurality of channels extending through the gate electrodes; and
a plurality of charge storage structures disposed between the channels and the gate electrodes.

18. The semiconductor device of claim 16, wherein the passive device comprises:
an insulating interlayer; and
a plurality of conductive patterns extending through the insulating interlayer,
wherein each of the conductive patterns contacts one of the upper bonding patterns, and
wherein neighboring two of the conductive patterns and a portion of the insulating interlayer therebetween form a capacitor.

* * * * *